(12) United States Patent
Agari

(10) Patent No.: US 10,847,404 B2
(45) Date of Patent: Nov. 24, 2020

(54) SHEET STICKING METHOD

(71) Applicant: DISCO CORPORATION, Tokyo (JP)

(72) Inventor: Masamitsu Agari, Tokyo (JP)

(73) Assignee: DISCO CORPORATION, Tokyo (JP)

(*) Notice: Subject to any disclaimer, the term of this patent is extended or adjusted under 35 U.S.C. 154(b) by 0 days.

(21) Appl. No.: 15/977,656

(22) Filed: May 11, 2018

(65) Prior Publication Data

US 2018/0330979 A1 Nov. 15, 2018

(30) Foreign Application Priority Data

May 11, 2017 (JP) ................. 2017-094960

(51) Int. Cl.
*H01L 21/683* (2006.01)
(52) U.S. Cl.
CPC .. *H01L 21/6836* (2013.01); *H01L 2221/6834* (2013.01); *H01L 2221/68327* (2013.01); *H01L 2221/68377* (2013.01)
(58) Field of Classification Search
CPC ............... H01L 21/6836; H01L 21/78; H01L 2221/68377; H01L 2221/68327; H01L 2221/6834
See application file for complete search history.

(56) References Cited

U.S. PATENT DOCUMENTS

| | | | |
|---|---|---|---|
| 6,271,102 B1 | 8/2001 | Brouillette et al. | |
| 6,465,330 B1 * | 10/2002 | Takahashi | B24B 37/04 |
| | | | 428/343 |
| 6,827,636 B2 | 12/2004 | Yamada | |
| 6,998,571 B2 | 2/2006 | Sekiya et al. | |
| 7,087,857 B2 | 8/2006 | Nakamura et al. | |
| 7,179,723 B2 | 2/2007 | Genda et al. | |
| 7,183,007 B2 | 2/2007 | Yamamoto | |
| 7,446,022 B2 | 11/2008 | Yoshikawa et al. | |
| 8,124,909 B2 | 2/2012 | Sawabe et al. | |
| 8,168,030 B2 | 5/2012 | Matsuo et al. | |

(Continued)

FOREIGN PATENT DOCUMENTS

| | | |
|---|---|---|
| JP | 10305420 A | 11/1998 |
| JP | 2002192370 A | 7/2002 |

(Continued)

OTHER PUBLICATIONS

Moore, "Sticky Issues with Semiconductor Processing Tape", Semiconductor Equipment Corp., Mar. 26, 2014, https://www.semicorp.com/articles/published-articles/item/sticky-issues-with-semiconductor-processing-tape (Year: 2014).*

(Continued)

*Primary Examiner* — Michael N Orlando
*Assistant Examiner* — Christopher W Raimund
(74) *Attorney, Agent, or Firm* — Greer Burns & Crain, Ltd.

(57) ABSTRACT

There is provided a sheet sticking method including a sheet sticking step of sticking a sheet to a plate-shaped object and mounting the sheet to which the plate-shaped object is stuck to a ring-shaped frame having an opening to form a plate-shaped object unit including the ring-shaped frame, the plate-shaped object housed in the opening of the ring-shaped frame, and the sheet stuck to the plate-shaped object, and a tension alleviation step of alleviating tension generated in the sheet in the sheet sticking step after the sheet sticking step is carried out.

10 Claims, 20 Drawing Sheets

(56) References Cited

U.S. PATENT DOCUMENTS

| | | |
|---|---|---|
| 8,263,900 B2 | 9/2012 | Maehara et al. |
| 8,288,679 B2 | 10/2012 | Unrath |
| 8,314,014 B2 | 11/2012 | Morikazu |
| 8,378,257 B2 | 2/2013 | Nomaru et al. |
| 8,431,428 B2 | 4/2013 | Sekiya |
| 8,624,156 B2 | 1/2014 | Matsuo et al. |
| 8,704,125 B2 | 4/2014 | Kettner-Reich |
| 8,779,325 B2 | 7/2014 | Nomaru et al. |
| 8,847,113 B2 | 9/2014 | Unrath et al. |
| 9,095,931 B2 | 8/2015 | Morikazu |
| 9,117,895 B2 | 8/2015 | Morikazu et al. |
| 9,172,202 B2 | 10/2015 | Imai et al. |
| 9,421,638 B2 | 8/2016 | Nakagawa et al. |
| 9,649,775 B2 | 5/2017 | Kumazawa |
| 9,656,347 B2 | 5/2017 | Morikazu |
| 9,724,783 B2 | 8/2017 | Odagiri et al. |
| 9,796,049 B2 | 10/2017 | Nomaru et al. |
| 9,862,055 B2 | 1/2018 | Goya et al. |
| 9,870,961 B2 | 1/2018 | Iwamoto et al. |
| 9,895,768 B2 | 2/2018 | Kuki et al. |
| 2005/0164509 A1* | 7/2005 | Koshimizu ......... H01L 21/6835 438/691 |
| 2005/0196941 A1* | 9/2005 | Park .................. H01L 21/78 438/462 |
| 2005/0205531 A1 | 9/2005 | Iizuka |
| 2006/0084239 A1* | 4/2006 | Nagai .................. B28D 5/0011 438/460 |
| 2006/0157191 A1 | 7/2006 | Matsuo et al. |
| 2007/0105345 A1 | 5/2007 | Kurosawa |
| 2008/0108262 A1 | 5/2008 | Asai et al. |
| 2009/0280622 A1* | 11/2009 | Genda .................. H01L 21/78 438/462 |
| 2010/0087023 A1 | 4/2010 | Endo |
| 2014/0315372 A1* | 10/2014 | Nakamura ......... H01L 21/6836 438/462 |
| 2016/0007479 A1* | 1/2016 | Hattori .............. H01L 21/67132 29/740 |
| 2016/0326403 A1* | 11/2016 | Yoneyama ......... H01L 21/6836 |

FOREIGN PATENT DOCUMENTS

| | | | | |
|---|---|---|---|---|
| JP | 2002334852 A | | 11/2002 | |
| JP | 2002343747 A | * | 11/2002 | ......... H01L 21/6836 |
| JP | 2005116739 A | * | 4/2005 | |
| JP | 2005116739 A | | 4/2005 | |
| JP | 2007007668 A | | 1/2007 | |
| JP | 2007027562 A | | 2/2007 | |
| JP | 2015082642 A | | 4/2015 | |

OTHER PUBLICATIONS

Clark et al., "Chapter 5, Wafer Finishing—Dicing, Picking, Shipping", in Area Array Interconnection Handbook, Puttlitz et al. (eds.), Springer Science Business Media, New York (2001). (Year: 2001).*

Kumar et al. ("Evaluation of Stresses in Thin Device Wafer using Piezoresistive Stress Sensor," 2008 10th Electronics Packaging Technology Conference, Singapore, pp. 1270-1276, 2008. (Year: 2008).*

Levinson, "Dicing Through Hard and Brittle Materials in the Micro Electronic Industry", Advanced Dicing Technologies, Feb. 1, 2001 (http://www.electron-mec.com/wp-content/uploads/applications/DicingThroughtHardBrittleMaterials.pdf) (Year: 2001).*

Yamada, Hiroaki, U.S. Appl. No. 15/835,096, filed Dec. 7, 2017.

\* cited by examiner

SHEET STICKING METHOD

BACKGROUND OF THE INVENTION

Field of the Invention

The present invention relates to a sheet sticking method for sticking a sheet to a plate-shaped object.

Description of the Related Art

A wafer as a plate-shaped object that is stuck to a sheet and in which starting points of dividing are formed (for example, refer to Japanese Patent No. 3408805) is divided into individual devices through expansion of the sheet by expanding apparatus. Furthermore, a die attach film (DAF) is stuck to a wafer divided into devices by so-called dicing before grinding (DBG) processing in which the wafer is subjected to half cutting by cutting processing and then the back surface is subjected to grinding processing. The DAF stuck to the above-described wafer is divided by expanding apparatus (for example, refer to Japanese Patent Laid-open No. 2007-027562) or is separated by irradiation with a laser beam (for example, refer to Japanese Patent Laid-open No. 2005-116739). Moreover, when the above-described sheet is stuck to the wafer, tension parallel to the rolling direction of a tape sticking roller of sticking apparatus (for example, refer to Japanese Patent Laid-open No. 2015-082642) is generated in the sheet.

SUMMARY OF THE INVENTION

When tension is generated, the above-described sheet becomes difficult to expand in the direction of this tension because a force of contraction in the direction of the tension is applied to the sheet. For this reason, in the sheet in which tension is generated, a difference in the amount of actual expansion (amount of stretch) is generated depending on the direction even when the sheet is evenly expanded in all directions. If a difference in the amount of expansion is generated depending on the direction in the sheet, problems that it is impossible to form a sufficient device interval depending on the direction, that it is impossible to divide the wafer into individual devices, and so forth occur.

Furthermore, if a DAF is stuck to a wafer after DBG processing, because tension parallel to the rolling direction of a tape sticking roller of sticking apparatus is generated in the DAF, so-called die shift, in which the arrangement of individually-divided devices is displaced due to the tension, occurs to a large extent. If the die shift occurs to a large extent in the wafer, there is a problem that it takes a long time to carry out irradiation with a laser beam in such a manner as to follow processing lines at the time of the irradiation with the laser beam when the DAF is separated and the productivity decreases.

Therefore, an object of the present invention is to provide a sheet sticking method that can suppress unevenness of the interval between devices or provide a sheet sticking method that can suppress die shift.

In accordance with an aspect of the present invention, there is provided a sheet sticking method for sticking a sheet to a plate-shaped object. The sheet sticking method includes a sheet sticking step of sticking the sheet to the plate-shaped object and mounting the sheet to which the plate-shaped object is stuck to a ring-shaped frame having an opening to form a plate-shaped object unit including the ring-shaped frame, the plate-shaped object housed in the opening of the ring-shaped frame, and the sheet stuck to the plate-shaped object, and a tension alleviation step of alleviating tension generated in the sheet in the sheet sticking step after the sheet sticking step is carried out.

Preferably, in the tension alleviation step, the tension generated in the sheet is alleviated based on change in the plate-shaped object unit over time by setting a certain time interval after the sheet sticking step is carried out.

Preferably, the tension alleviation step is carried out by heating the sheet exposed between an outer circumferential edge of the plate-shaped object of the plate-shaped object unit and an inner circumferential edge of the ring-shaped frame.

Alternatively, the tension alleviation step is carried out by heating the whole of the plate-shaped object unit.

Preferably, the sheet includes a base sheet and a die attach sheet disposed on the base sheet.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Modes (embodiments) for carrying out the present invention will be described in detail with reference to the drawings. The present invention is not limited by the contents described in the following embodiments. Furthermore, in constituent elements described below, what can be easily envisaged by those skilled in the art and what are substantially the same are included. Moreover, it is possible to combine configurations described below as appropriate. In addition, it is possible to carry out various kinds of omission, replacement, or change of configurations without departing from the gist of the present invention.

First Embodiment

Figure 1:
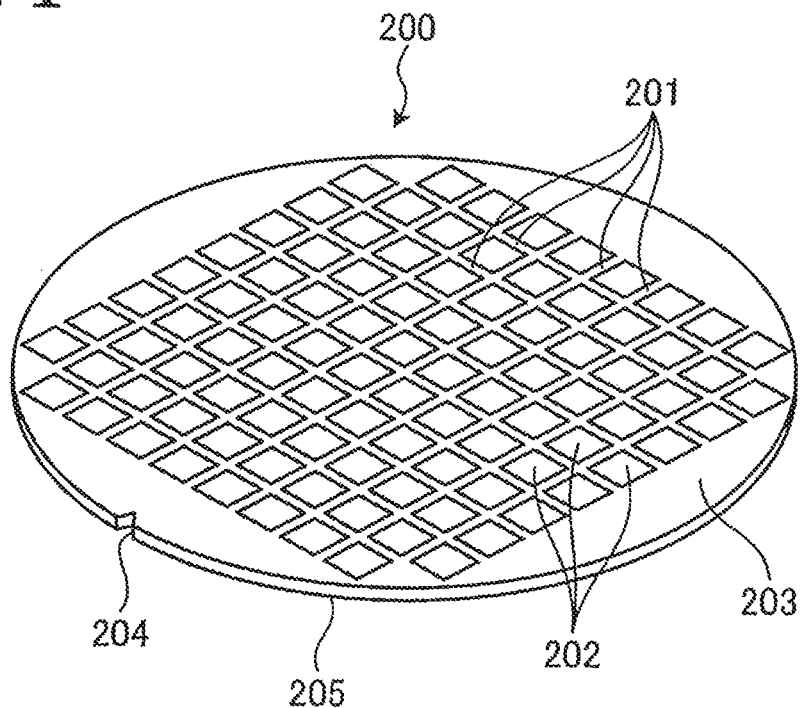
FIG. 1 is a perspective view showing one example of a plate-shaped object of a processing target of a processing method including a sheet sticking method according to a first embodiment.

A sheet sticking method according to a first embodiment of the present invention will be described based on the drawings. FIG. 1 is a perspective view showing one example of a plate-shaped object of a processing target of a processing method that is the sheet sticking method according to the first embodiment.

The sheet sticking method according to the first embodiment is a processing method of a plate-shaped object 200 shown in FIG. 1. In the first embodiment, the plate-shaped object 200 is a semiconductor wafer or an optical device wafer that includes silicon, sapphire, gallium arsenide, or the like as a substrate and has a circular disc shape. As shown in FIG. 1, the plate-shaped object 200 has a front surface 203 on which a device 202 is formed in each of the respective regions marked out by plural streets 201 that intersect. Furthermore, a notch 204 that indicates the crystal orientation is made in the plate-shaped object 200. In the present invention, an orientation flat that indicates the crystal orientation may be made in the plate-shaped object 200. Moreover, in the present invention, the plate-shaped object 200 is not limited to a workpiece on which various kinds of processing are carried out, such as a semiconductor wafer or an optical device wafer, but may be any object as long as it is a plate-shaped object such as a glass plate or a ceramic plate, for example.

Figure 2:
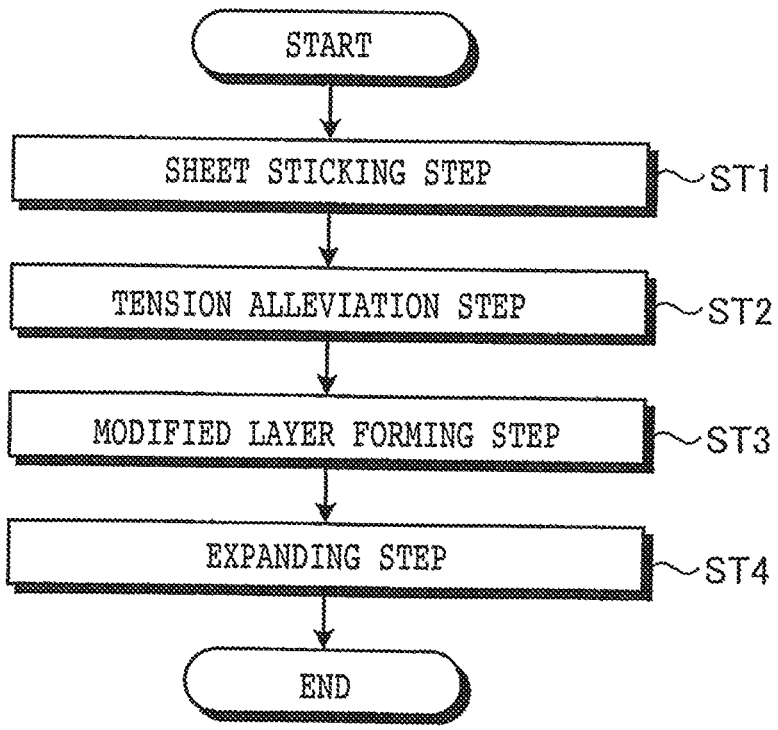
FIG. 2 is a flowchart showing the flow of the processing method including the sheet sticking method according to the first embodiment.
Figure 3:
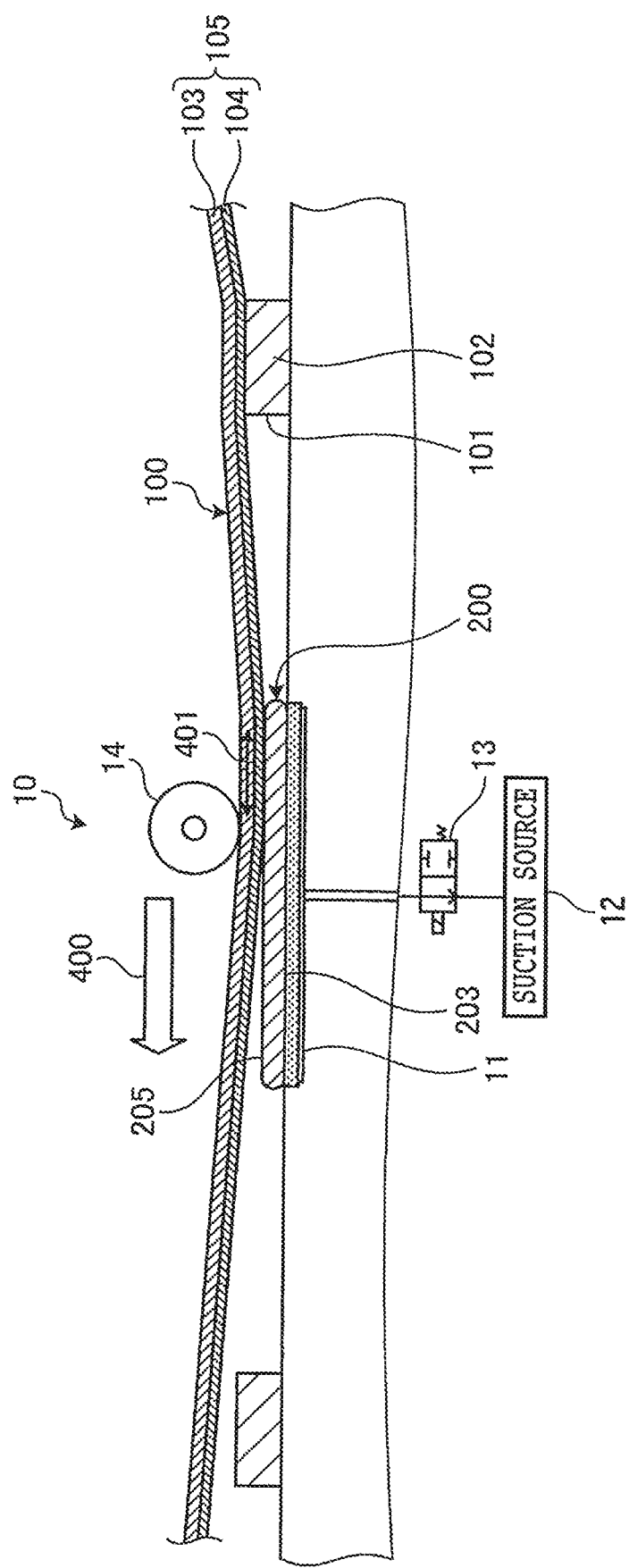
FIG. 3 is a side sectional view showing a sheet sticking step of the processing method shown in FIG. 2.
Figure 4:
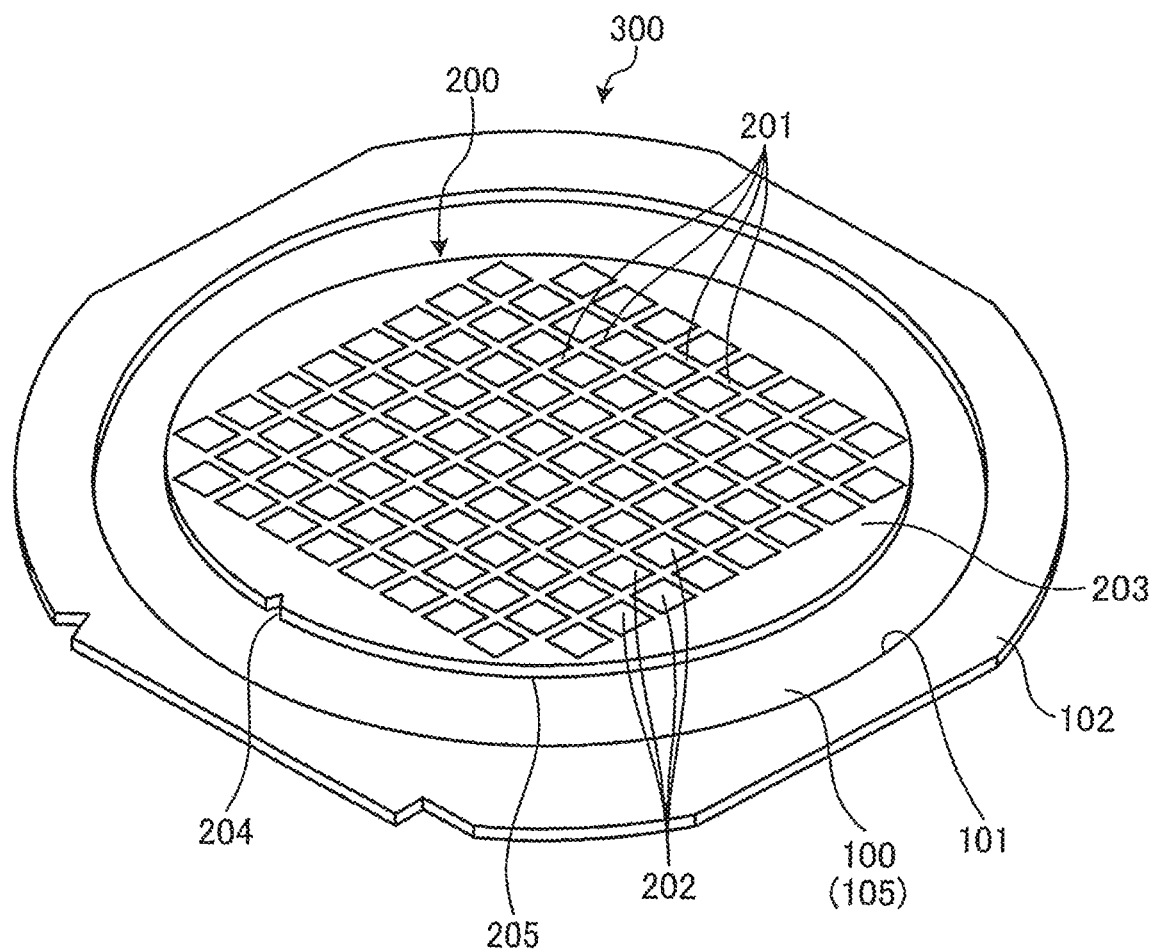
FIG. 4 is a perspective view of the plate-shaped object and so forth after the sheet sticking step of the processing method shown in FIG. 2.
Figure 5:
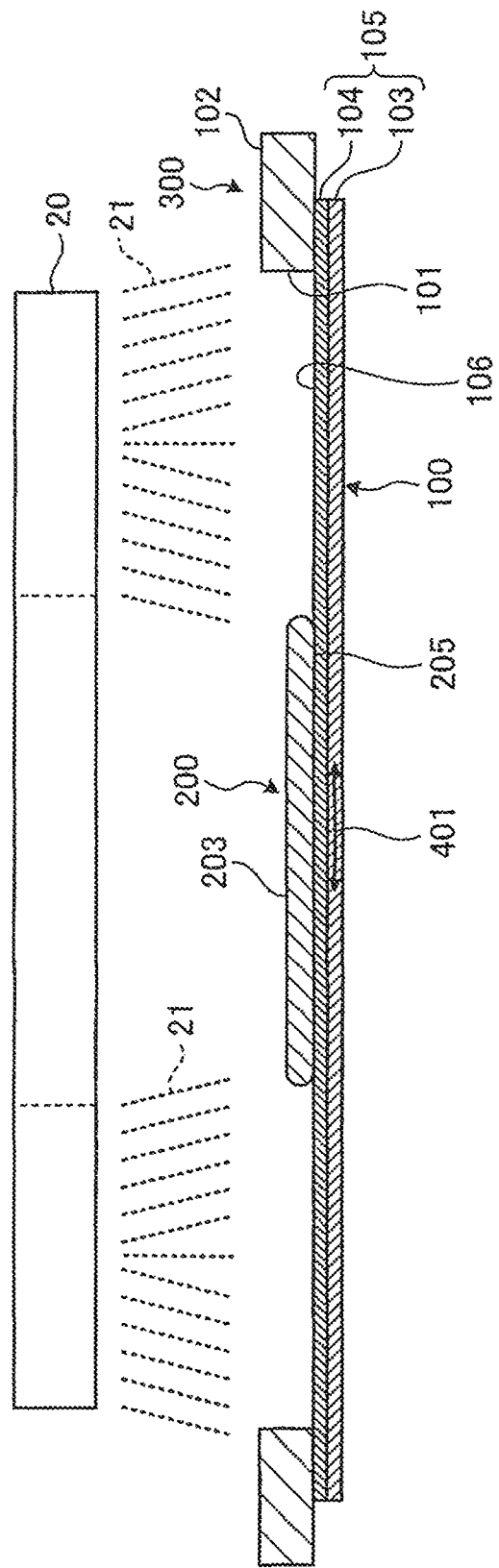
FIG. 5 is a side sectional view showing a tension alleviation step of the processing method shown in FIG. 2.
Figure 6:
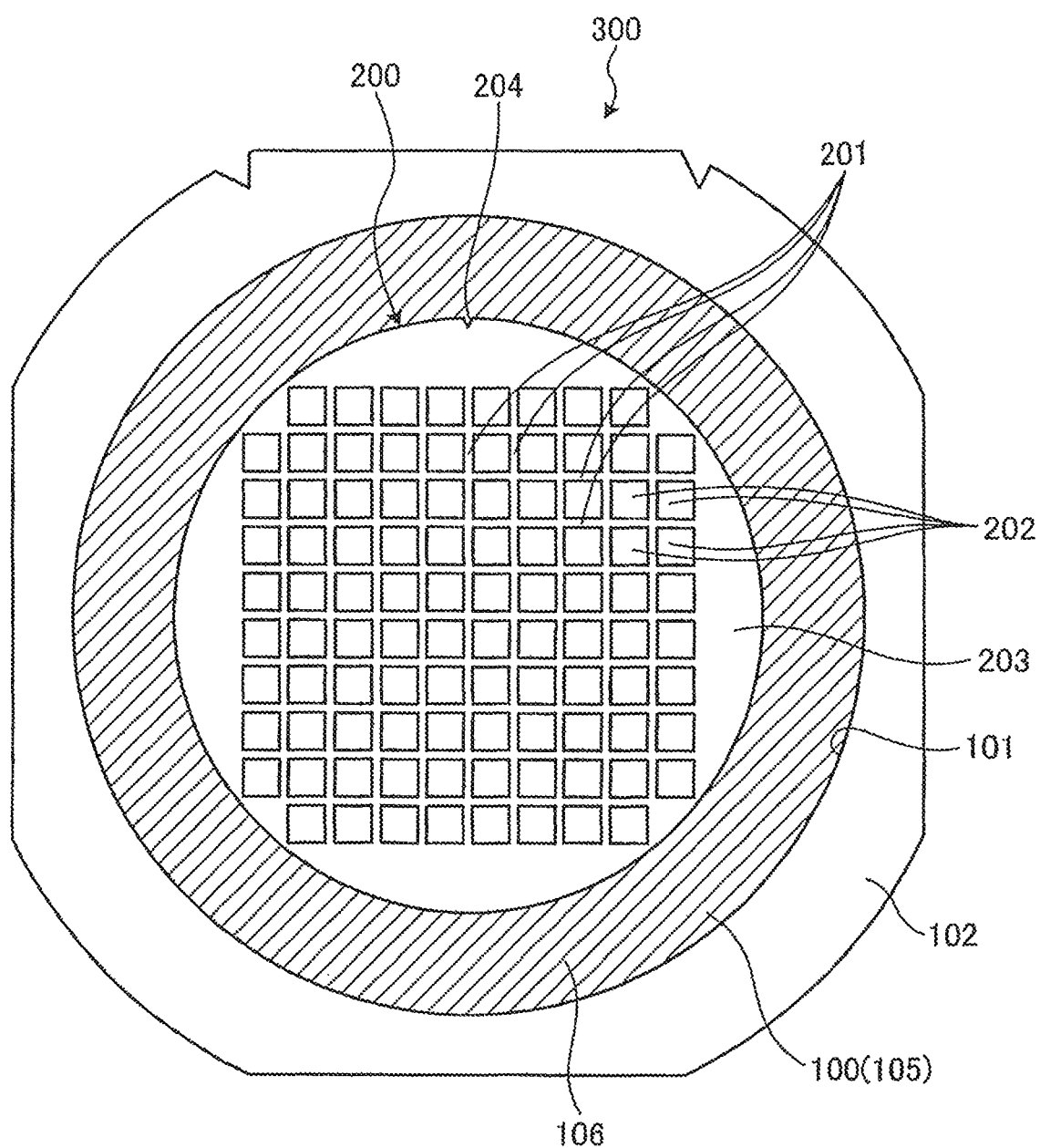
FIG. 6 is a plan view showing a heated part in a sheet in the tension alleviation step of the processing method shown in FIG. 2.
Figure 7:
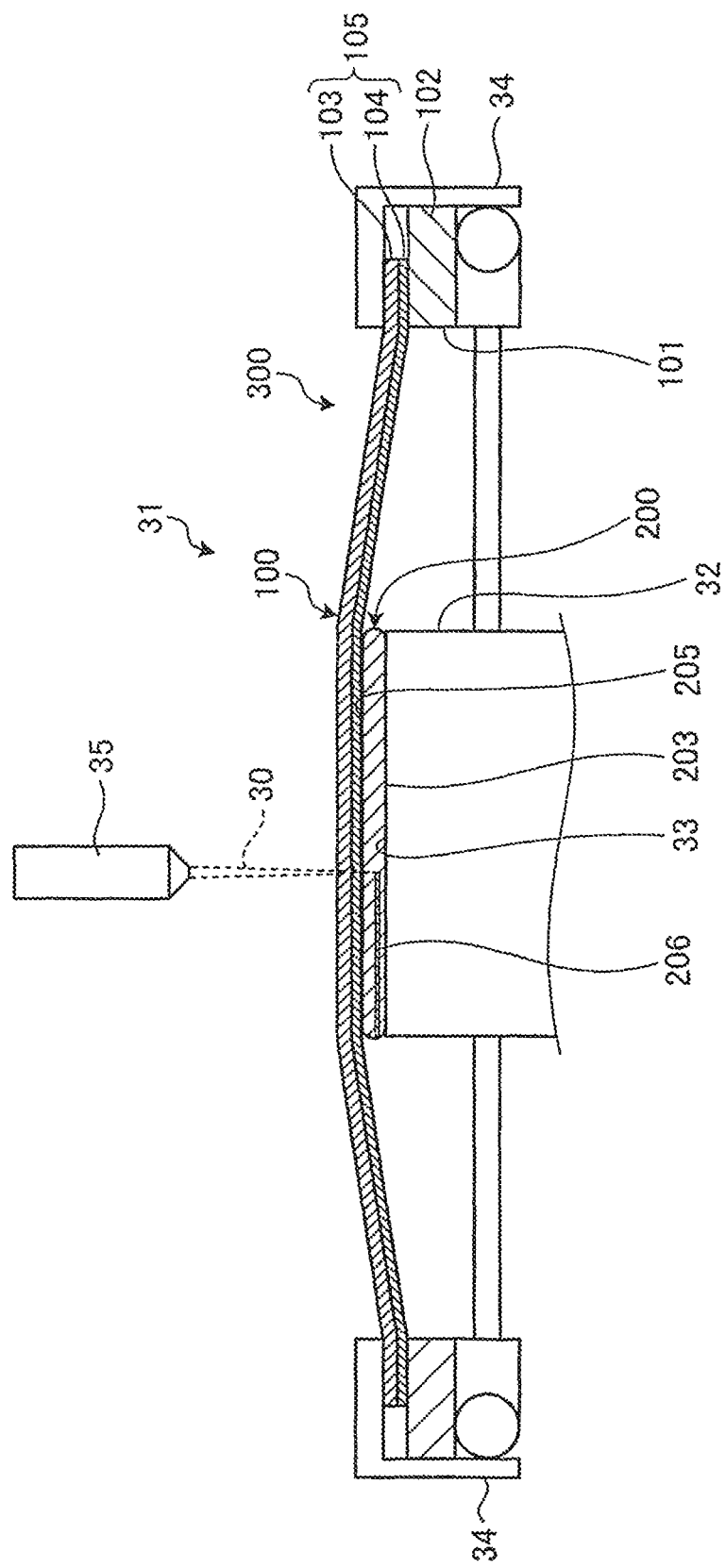
FIG. 7 is a side sectional view showing a modified layer forming step of the processing method shown in FIG. 2.
Figure 8:
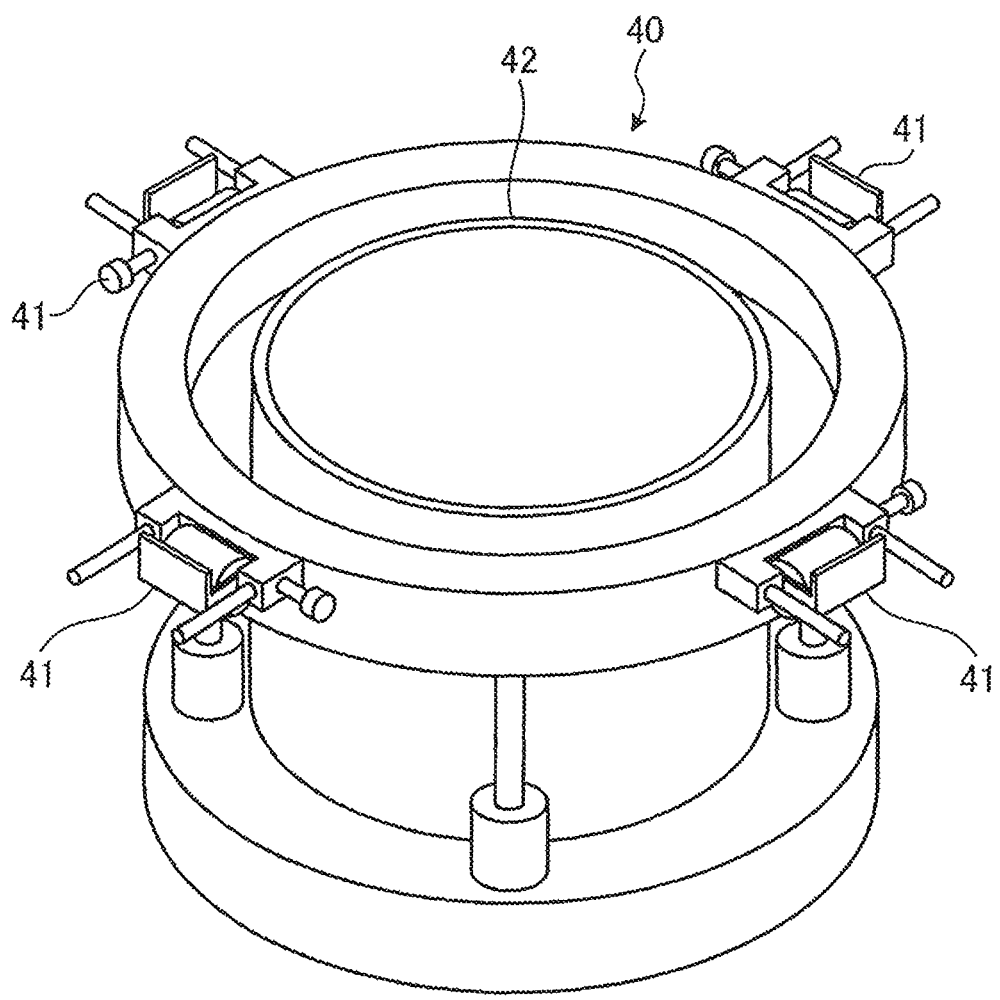
FIG. 8 is a perspective view showing a configuration example of expanding apparatus used in an expanding step of the processing method shown in FIG. 2.
Figure 9:
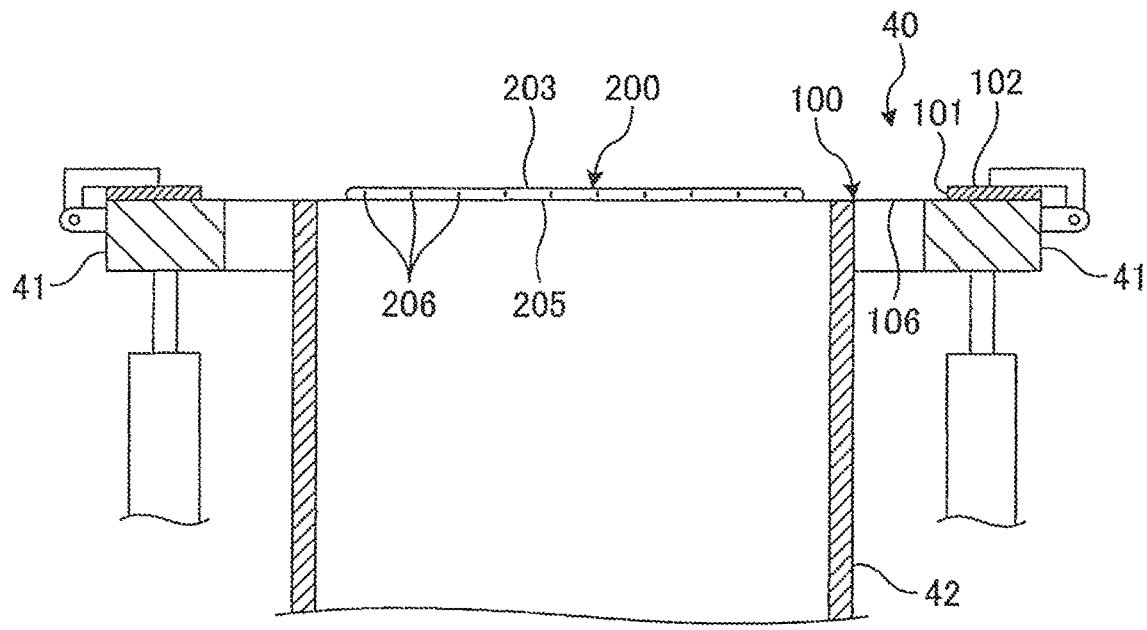
FIG. 9 is a side sectional view of the state in which the plate-shaped object is held on the expanding apparatus in the expanding step of the processing method shown in FIG. 2.
Figure 10:
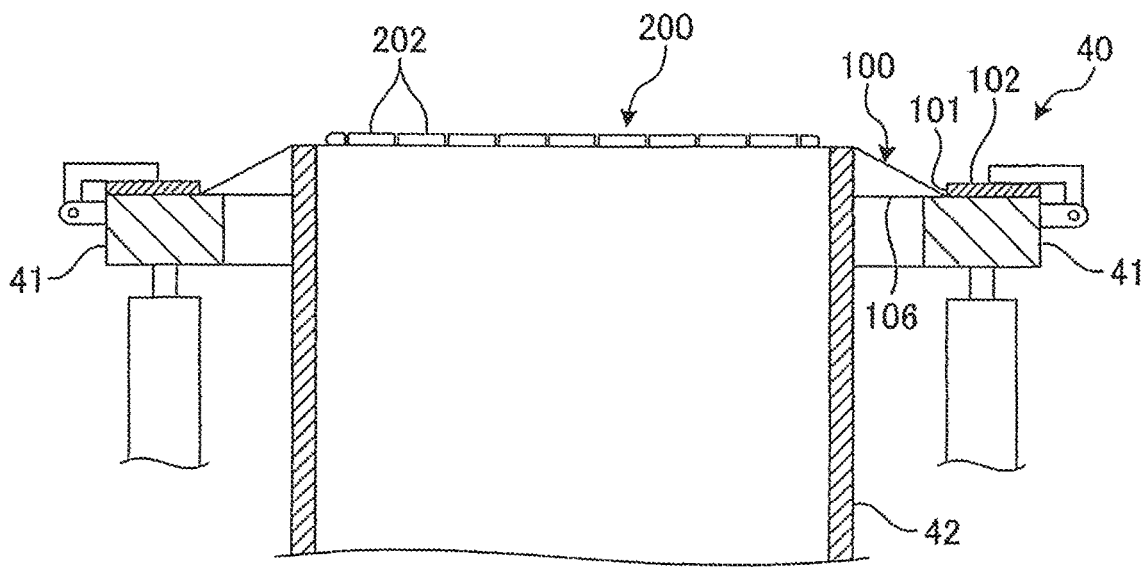
FIG. 10 is a side sectional view showing the state in which the sheet stuck to the plate-shaped object is expanded in the expanding step of the processing method shown in FIG. 2.

FIG. 2 is a flowchart showing the flow of the processing method that is the sheet sticking method according to the first embodiment. FIG. 3 is a side sectional view showing a sheet sticking step of the processing method shown in FIG. 2. FIG. 4 is a perspective view of the plate-shaped object and so forth after the sheet sticking step of the processing method shown in FIG. 2. FIG. 5 is a side sectional view showing a tension alleviation step of the processing method shown in FIG. 2. FIG. 6 is a plan view showing a heated part in the sheet in the tension alleviation step of the processing method shown in FIG. 2. FIG. 7 is a side sectional view showing a modified layer forming step of the processing method shown in FIG. 2. FIG. 8 is a perspective view showing a configuration example of expanding apparatus used in an expanding step of the processing method shown in FIG. 2. FIG. 9 is a side sectional view of the state in which the plate-shaped object is held on the expanding apparatus in the expanding step of the processing method shown in FIG. 2. FIG. 10 is a side sectional view showing the state in which the sheet stuck to the plate-shaped object is expanded in the expanding step of the processing method shown in FIG. 2.

The processing method that is the sheet sticking method according to the first embodiment is a method in which a sheet 100 shown in FIG. 3 is stuck to the plate-shaped object 200 shown in FIG. 1. Furthermore, in the first embodiment, the processing method is also a method in which the plate-shaped object 200 is cut along the streets 201 and is divided into the individual devices 202. As shown in FIG. 2, the processing method includes a sheet sticking step ST1, a tension alleviation step ST2, a modified layer forming step ST3, and an expanding step ST4.

The sheet sticking step ST1 is a step of sticking the sheet 100 to the plate-shaped object 200 and mounting the sheet 100 to which the plate-shaped object 200 is stuck onto a ring-shaped frame 102 having an opening 101 to form a plate-shaped object unit 300 shown in FIG. 4. As shown in FIG. 4, the plate-shaped object unit 300 includes the ring-shaped frame 102, the sheet 100, and the plate-shaped object 200.

The ring-shaped frame 102 is formed into a ring shape having the opening 101 inside. The peripheral part of the sheet 100 is stuck to the ring-shaped frame 102 and the central part of the sheet 100 is stuck to a back surface 205 of the plate-shaped object 200 on the back side of the front surface 203. As shown in FIG. 3, the sheet 100 is formed of a base sheet 105 including a base material layer 103 formed of a synthetic resin and a glue layer 104 that is disposed on the base material layer 103 and is stuck to the back surface 205 of the plate-shaped object 200. In the first embodiment, the base material layer 103 includes polyolefin (PO) or polyvinyl chloride (PVC). However, the synthetic resin that forms the base material layer 103 is not limited to them. The plate-shaped object 200 is housed in the opening 101 of the ring-shaped frame 102 due to the sticking of the central part of the sheet 100 to the back surface 205.

In the sheet sticking step ST1, an operator of sticking apparatus 10 shown in FIG. 3 places the front surface 203 of the plate-shaped object 200 on a porous suction holding part 11 of the sticking apparatus 10 and places the ring-shaped frame 102 on a frame holding part, which is not shown in the diagram. In the sheet sticking step ST1, the operator actuates the sticking apparatus 10 and the sticking apparatus 10 causes a suction force of a suction source 12 formed of a vacuum pump or the like to act on the suction holding part 11 through an open-close valve 13 to hold the plate-shaped object 200 on the suction holding part 11 by suction.

In the sheet sticking step ST1, the sticking apparatus 10 drives feeding apparatus to feed the sheet 100 to the upper side of the plate-shaped object 200 and the ring-shaped frame 102 in the state in which the glue layer 104 is opposed to the back surface 205 of the plate-shaped object 200 and the ring-shaped frame 102. In the sheet sticking step ST1, as shown in FIG. 3, the sticking apparatus 10 presses the sheet 100 against the ring-shaped frame 102 and the back surface 205 of the plate-shaped object 200 by a tape sticking roller 14 while moving the tape sticking roller 14 along an arrow (hereinafter, represented as the movement direction) 400 as the left-right direction in the diagram, to stick the sheet 100 to the ring-shaped frame 102 and the back surface 205 of the plate-shaped object 200. In the first embodiment, the longitudinal direction of the tape sticking roller 14 is orthogonal to the movement direction 400 of the tape sticking roller 14. The movement direction 400 of the tape sticking roller 14 is a straight line as shown in FIG. 3.

In the sheet sticking step ST1, the sticking apparatus 10 cuts the sheet 100 stuck to the ring-shaped frame 102 and the back surface 205 of the plate-shaped object 200 into a circular shape corresponding to the ring-shaped frame 102 by using a tape cutter, which is not shown in the diagram. The sheet sticking step ST1 forms the plate-shaped object unit 300 in this manner. The sheet 100 is stuck to the ring-shaped frame 102 and the plate-shaped object 200 through being pressed against them by the tape sticking roller 14 moved along the movement direction 400, which is the straight line. Therefore, when the sheet 100 is stuck, tension 401 (represented by arrows in FIG. 3, FIG. 5, and so forth) that is a tensile force in directions from the plate-shaped object 200 toward the ring-shaped frame 102 is generated along the movement direction 400. That is, when being stuck, the sheet 100 is stuck in the pulled state. For this reason, stress in the opposite directions to the tension 401 generated when the plate-shaped object 200 is stuck to the sheet 100 (i.e. directions from the ring-shaped frame 102 toward the plate-shaped object 200) is applied to the plate-shaped object unit 300. Because the stress is applied to the plate-shaped object unit 300 in the direction of contraction against the direction of the tension 401, the sheet 100 becomes difficult to expand and the interval between the devices 202 becomes difficult to widen in the expanding step ST4. In the sheet sticking step ST1, after the sticking apparatus 10 cuts the sheet 100, the suction holding of the plate-shaped object 200 by the suction holding part 11 is stopped and the operator removes the plate-shaped object unit 300 from the sticking apparatus 10 to proceed to the tension alleviation step ST2.

The tension alleviation step ST2 is a step of alleviating the tension 401 generated in the sheet 100 in the sheet sticking step ST1 after the sheet sticking step ST1 is carried out. In the tension alleviation step ST2, as shown in FIG. 5, an operator makes the plate-shaped object unit 300 be opposed to a heating unit 20 having a circular ring shape. The heating unit 20 is formed into the same shape as a region 106 in the sheet 100 between the inner circumference of the ring-shaped frame 102 and the outer circumference of the plate-shaped object 200, represented by parallel oblique lines in FIG. 6. The region 106 is one part of the sheet 100 exposed between the outer circumferential edge of the plate-shaped object 200 of the plate-shaped object unit 300 and the inner circumferential edge of the ring-shaped frame 102. In the first embodiment, the heating unit 20 is a hot air heater that blows hot air at a temperature higher than ordinary temperature. However, the heating unit 20 is not limited to the hot air heater and may be an infrared heater, a lamp, or the like. Furthermore, in the first embodiment, the heating unit 20 forms expanding apparatus 40 shown in FIG. 8. However, in the present invention, the configuration is not limited thereto.

In the tension alleviation step ST2, the ring-shaped frame 102 is fixed by being clamped by clamp parts 41 of the expanding apparatus 40 shown in FIG. 8 and the region 106 represented by the parallel oblique lines in FIG. 6 is made opposed to the heating unit 20. Thereafter, as shown in FIG. 5, hot air 21 is blown from the heating unit 20 to the region 106 of the sheet 100. The tension alleviation step ST2 is carried out by heating the region 106 of the sheet 100 for a predetermined time prescribed in advance (for example, 30 seconds) until the temperature of the region 106 becomes equal to or higher than 50° C. and equal to or lower than 90° C. When the region 106 of the sheet 100 is heated, the tension 401 generated inside is weakened. Furthermore, in the first embodiment, the heating unit 20 heats the sheet 100 from the side of the front surface 203 of the plate-shaped object 200 in the tension alleviation step ST2. However, in the present invention, the sheet 100 may be heated from the side of the back surface 205 of the plate-shaped object 200.

It is preferable for the predetermined time and the temperature of the region 106 of the sheet 100 to be time and temperature that allow the sheet 100 to be sufficiently softened and promote alleviation of the tension 401 (temperature that alleviates the tension 401). Furthermore, it is preferable for the predetermined time and the temperature of the region 106 of the sheet 100 to be time and temperature with which the difference in the interval between the devices 202 adjacent to each other between the direction parallel to the tension 401 and the direction orthogonal to the tension 401 is as small as possible when the sheet 100 is expanded in the expanding step ST4. Moreover, it is favorable for the predetermined time and the temperature of the region 106 of the sheet 100 to be time and temperature with which the devices 202 adjacent to each other can be divided and the interval between the devices 202 becomes an interval that enables the devices 202 after the dividing to be picked up (removed) from the sheet 100 by pick-up apparatus, which is not shown in the diagram. When the heating of the region 106 of the sheet 100 in the tension alleviation step ST2 ends, the procedure proceeds to the modified layer forming step ST3.

The modified layer forming step ST3 is a step of, as shown in FIG. 7, irradiating the plate-shaped object 200 with a laser beam 30 with such a wavelength as to be transmitted through the plate-shaped object 200 along the streets 201 of the plate-shaped object 200 and forming a modified layer 206 that serves as starting points of breaking along the streets 201 inside the plate-shaped object 200. The modified layer 206 means a region that has become the state in which the density, the refractive index, the mechanical strength, or another physical property is different from that of the surroundings, and melting-treated region, crack region, insulation breakdown region, refractive-index-changed region, region in which these regions exist in a mixed manner, and so forth can be cited as examples.

In the modified layer forming step ST3, as shown in FIG. 7, an operator or the like places the front surface 203 of the plate-shaped object 200 on a porous holding surface 33 of a chuck table 32 of laser processing apparatus 31 that irradiates the plate-shaped object 200 with the laser beam 30. In the first embodiment, in the modified layer forming step ST3, the operator or the like may cause a porous sheet made of a resin to intervene between the porous holding surface 33 of the chuck table 32 and the plate-shaped object 200 in order to prevent the front surface 203 of the plate-shaped object 200 from directly getting contact with the holding surface 33 of the chuck table 32 and being damaged. In FIG. 7, the porous sheet made of a resin is omitted. Next, the laser processing apparatus 31 sucks the holding surface 33 by a vacuum suction source connected to the chuck table 32 via a vacuum suction path, which is not shown in the diagram, and holds the plate-shaped object 200 by suction by the holding surface 33 of the chuck table 32. Furthermore, the laser processing apparatus 31 drives clamp parts 34 provided around the chuck table 32 and at positions lower than the holding surface 33 by an air actuator, which is not shown in the diagram, and clamps and fixes the ring-shaped frame 102 by the clamp parts 34.

Then, in the modified layer forming step ST3, the laser processing apparatus 31 performs alignment of the plate-shaped object 200 based on an image acquired by an imaging unit, which is not shown in the diagram. Thereafter, in the modified, layer forming step ST3, the laser processing apparatus 31 carries out irradiation with the laser beam 30 with such a wavelength as to be transmitted through the plate-shaped object 200 from the side of the back surface 205 along the street 201, with the light focus point adjusted to the inside of the plate-shaped object 200, as shown in FIG. 7 while relatively moving the chuck table 32 and a laser beam irradiation unit 35. Thereby, the laser processing apparatus 31 forms the modified layer 206 along the street 201 inside the plate-shaped object 200. After the modified layer 206 is formed inside the plate-shaped object 200 along all streets 201 in the modified layer forming step ST3, the procedure proceeds to the expanding step ST4.

The expanding step ST4 is a step of giving an external force to the plate-shaped object 200 and dividing the plate-shaped object 200 into individual devices 202 along the modified layer 206 after the modified layer forming step ST3 is carried out. In the first embodiment, the expanding step ST4 gives the external force by expanding the sheet 100 in the surface direction. Specifically, an operator conveys the plate-shaped object unit 300 to the expanding apparatus 40 shown in FIG. 8 and fixes the ring-shaped frame 102 by clamping the ring-shaped frame 102 by the clamp parts 41 of the expanding apparatus 40 as shown in FIG. 9. At this time, as shown in FIG. 10, a circular-cylinder-shaped expanding drum 42 of the expanding apparatus 40 is made to abut against the region 106 of the sheet 100. The expanding drum 42 has inner diameter and outer diameter that, are smaller than the inner diameter of the ring-shaped frame 102 and are larger than the outer diameter of the plate-shaped object 200.

In the expanding step ST4, as shown in FIG. 10, the expanding apparatus 40 lowers the clamp parts 41. Thereupon, the sheet 100 is expanded in the surface direction because the sheet 100 abuts against the expanding drum 42. In the expanding step ST4, a tensile force acts on the sheet 100 radially as the result of the expansion of the sheet 100. When the tensile force radially acts on the sheet 100 stuck to the back surface 205 of the plate-shaped object 200 as above, because the modified layer 206 has been formed along the streets 201 in the plate-shaped object 200, the plate-shaped object 200 is divided into the individual devices 202, with the modified layer 206 formed along the streets 201 serving as the starting points. In addition, the gap between the devices 202 is widened and an interval is formed between the devices 202. The individually-divided devices 202 are removed from the sheet 100 by pick-up apparatus.

As above, the plate-shaped object 200 of the processing target of the processing method that is the sheet sticking method according to the first embodiment is a semiconductor wafer or an optical device wafer in which the modified layer 206 as starting points of dividing is formed in the modified layer forming step ST3 and that is divided into the individual devices 202, with the modified layer 206 serving as the starting points, in the expanding step ST4.

As described above, in the processing method that is the sheet sticking method according to the first embodiment, the tension alleviation step ST2 of alleviating the tension 401 generated in the sheet 100 is carried out after the sheet sticking step ST1 is carried out. Thus, stress in the opposite directions to the tension 401 applied to the sheet 100 can be alleviated. As a result, the processing method that is the sheet sticking method can inhibit the sheet 100 from becoming difficult to expand and suppress unevenness of the amount of stretch of the sheet 100 in the expanding step ST4. Thus, the processing method that is the sheet sticking method can suppress unevenness of the interval between the devices 202 after dividing into the devices 202.

Furthermore, in the processing method that is the sheet sticking method according to the first embodiment, the place at which the tension 401 is applied to the sheet 100 most after the sheet sticking step ST1 is carried out is the region 106 represented by parallel oblique lines in FIG. 6 in the sheet 100. In the processing method that is the sheet sticking method according to the first embodiment, the region 106 of the sheet 100 is heated in the tension alleviation step ST2 and thus the tension 401 of the sheet 100 can be alleviated across the whole circumference. Furthermore, in the processing method that is the sheet sticking method according to the first embodiment, if at least the region 106 of the sheet 100 is heated in the tension alleviation step ST2, unevenness of the interval between the devices 202 can be suppressed after the expanding step ST4.

Second Embodiment

Figure 11:
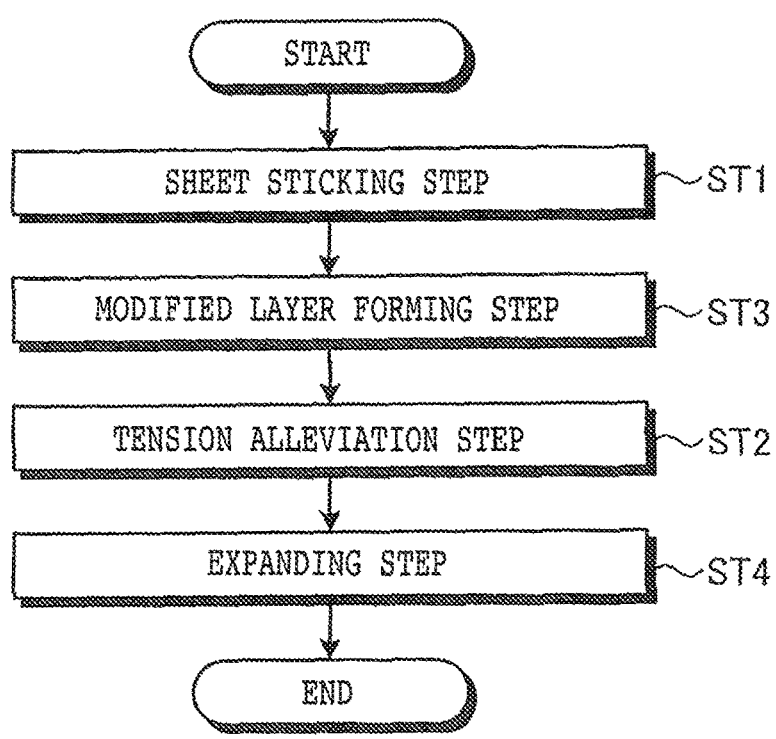
FIG. 11 is a flowchart showing the flow of a processing method that is a sheet sticking method according to a second embodiment.

A sheet sticking method according to a second embodiment of the present invention will be described based on the drawing. FIG. 11 is a flowchart showing the flow of a processing method that is the sheet sticking method according to the second embodiment. In FIG. 11, the same part as the first embodiment is given the same symbol and description thereof is omitted.

The processing method that is the sheet sticking method according to the second embodiment is the same as the processing method that is the sheet sticking method according to the first embodiment except that the order of execution of the tension alleviation step ST2 and the modified layer forming step ST3 is different from the first embodiment. Specifically, in the processing method that is the sheet sticking method according to the second embodiment, the sheet sticking step ST1, the modified layer forming step ST3, the tension alleviation step ST2, and the expanding step ST4 are sequentially carried out as shown in FIG. 11.

In the processing method that is the sheet sticking method according to the second embodiment, the tension alleviation step ST2 of alleviating the tension 401 generated in the sheet 100 is carried out after the sheet sticking step ST1 is carried out. Therefore, unevenness of the interval between the devices 202 after dividing into the devices 202 can be suppressed as with the first embodiment.

Third Embodiment

Figure 12:
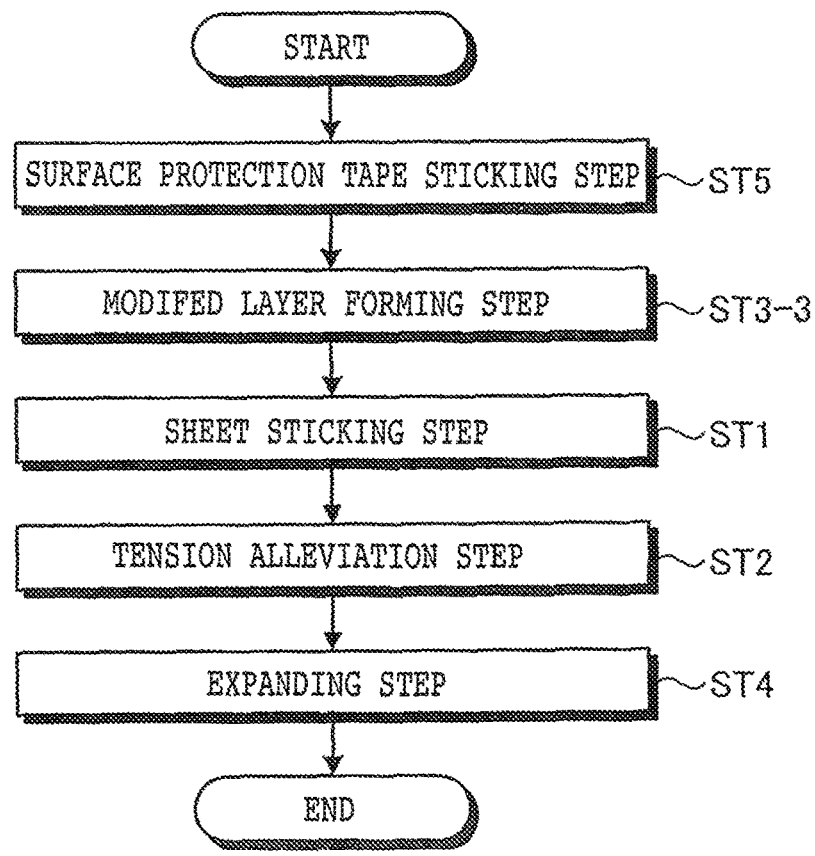
FIG. 12 is a flowchart showing the flow of a processing method that is a sheet sticking method according to a third embodiment.
Figure 13:
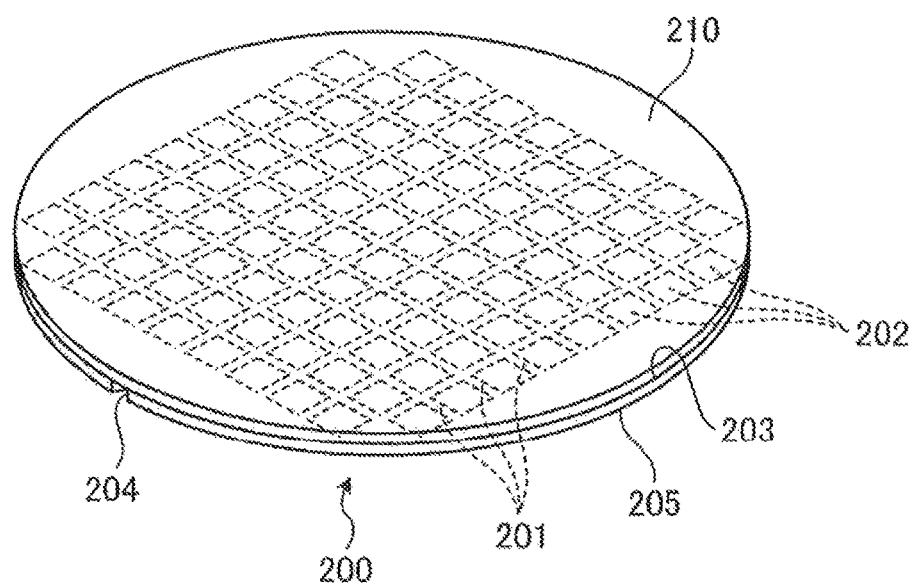
FIG. 13 is a perspective view showing a surface protection tape sticking step of the processing method shown in FIG. 12.
Figure 14:
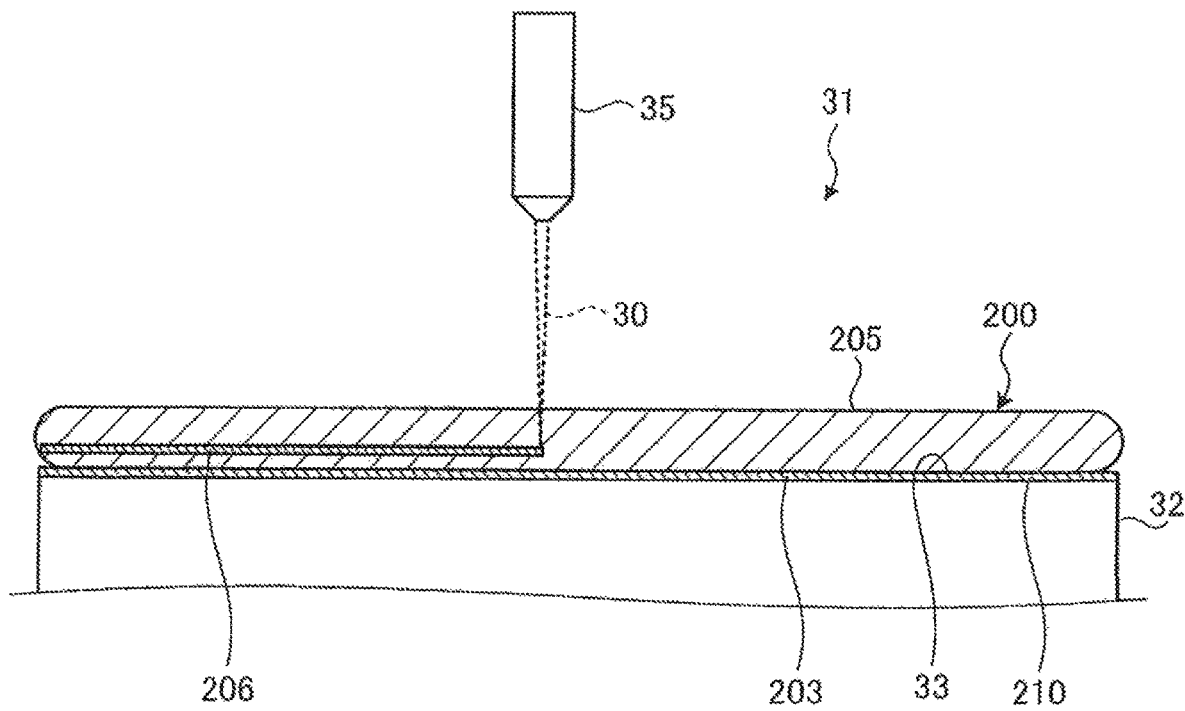
FIG. 14 is a side sectional view showing a modified layer forming step of the processing method shown in FIG. 12.

A sheet sticking method according to a third embodiment of the present invention will be described based on the drawings. FIG. 12 is a flowchart showing the flow of a processing method that is the sheet sticking method according to the third embodiment. FIG. 13 is a perspective view showing a surface protection tape sticking step of the processing method shown in FIG. 12. FIG. 14 is a side sectional view showing a modified layer forming step of the processing method shown in FIG. 12. In FIG. 12 to FIG. 14, the same part as the first embodiment is given the same symbol and description thereof is omitted.

In the processing method that is the sheet sticking method according to the third embodiment, as shown in FIG. 12, a surface protection tape sticking step ST5, a modified layer forming step ST3-3, the sheet sticking step ST1, the tension alleviation step ST2, and the expanding step ST4 are sequentially carried out.

The surface protection tape sticking step ST5 is a step of sticking a surface protection tape 210 to the front surface 203 of the plate-shaped object 200 as shown in FIG. 13. In the third embodiment, the surface protection tape 210 is formed into the same shape as the plate-shaped object 200.

The modified layer forming step ST3-3 is a step of irradiating the plate-shaped object 200 with the laser beam 30 with such a wavelength as to be transmitted through the plate-shaped object 200 along the streets 201 of the plate-shaped object 200 and forming the modified layer 206 that serves as starting points of breaking along the streets 201 inside the plate-shaped object 200 similarly to the first embodiment.

In the modified layer forming step ST3-3, as shown in FIG. 14, an operator or the like places the front surface 203 of the plate-shaped object 200 over the porous holding surface 33 of the chuck table 32 of the laser processing apparatus 31 with the intermediary of the surface protection tape 210 and the laser processing apparatus 31 holds the plate-shaped object 200 by suction by the holding surface 33 of the chuck table 32. Then, in the modified layer forming step ST3-3, similarly to the first embodiment, after performing alignment, the laser processing apparatus 31 carries out irradiation with the laser beam 30 with such a wavelength as to be transmitted through the plate-shaped object 200, with the light focus point adjusted to the inside of the plate-shaped object 200, while relatively moving the chuck table 32 and the laser beam irradiation unit 35 along the streets 201, to form the modified layer 206 along the streets 201 inside the plate-shaped object 200.

Then, the sheet sticking step ST1 is carried out and thereafter the surface protection tape 210 is peeled. Subsequently, the tension alleviation step ST2 and the expanding step ST4 are sequentially carried out. The sheet sticking step ST1, the tension alleviation step ST2, and the expanding step ST4 are carried out similarly to the processing method that is the sheet sticking method according to the first embodiment.

In the processing method that is the sheet sticking method according to the third embodiment, the tension alleviation step ST2 of alleviating the tension 401 generated in the sheet 100 is carried out after the sheet sticking step ST1 is carried out. Therefore, unevenness of the interval between the devices 202 after dividing into the devices 202 can be suppressed as with the first embodiment.

Fourth Embodiment

Figure 15:
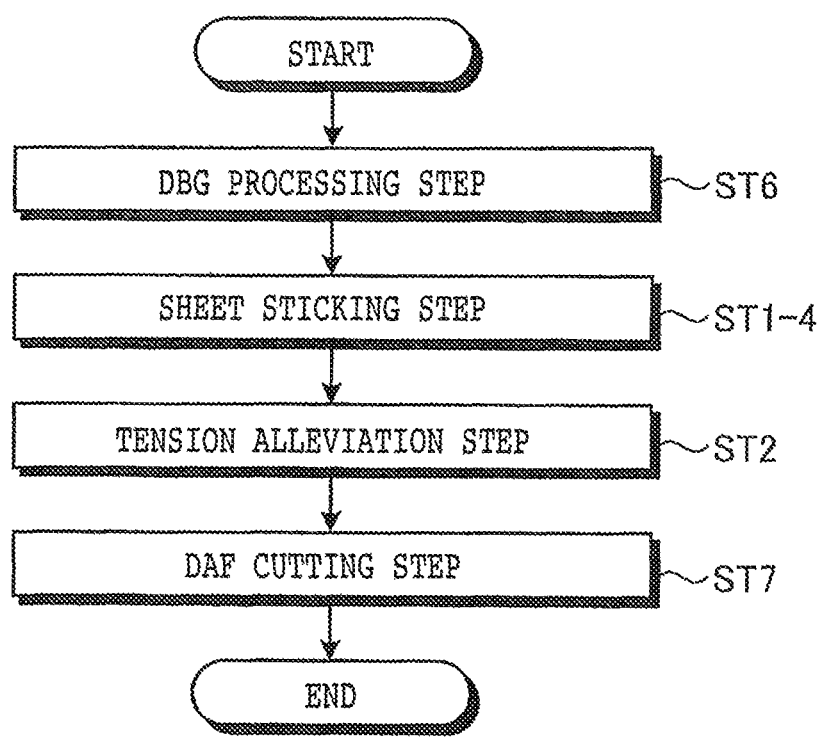
FIG. 15 is a flowchart showing the flow of a processing method that is a sheet sticking method according to a fourth embodiment.
Figure 16:
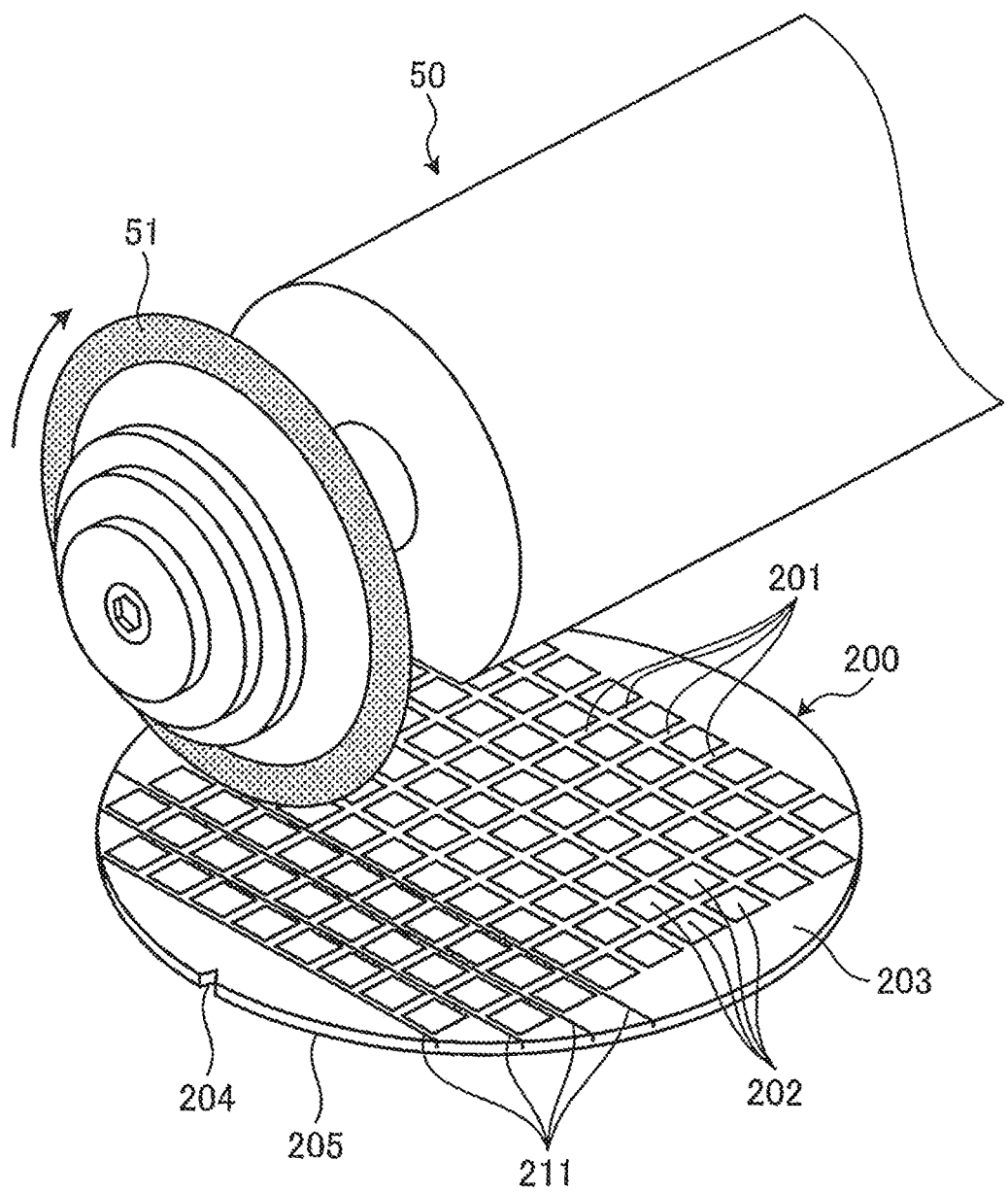
FIG. 16 is a perspective view showing a step of forming dividing grooves in a DBG processing step of the processing method shown in FIG. 15.
Figure 17:
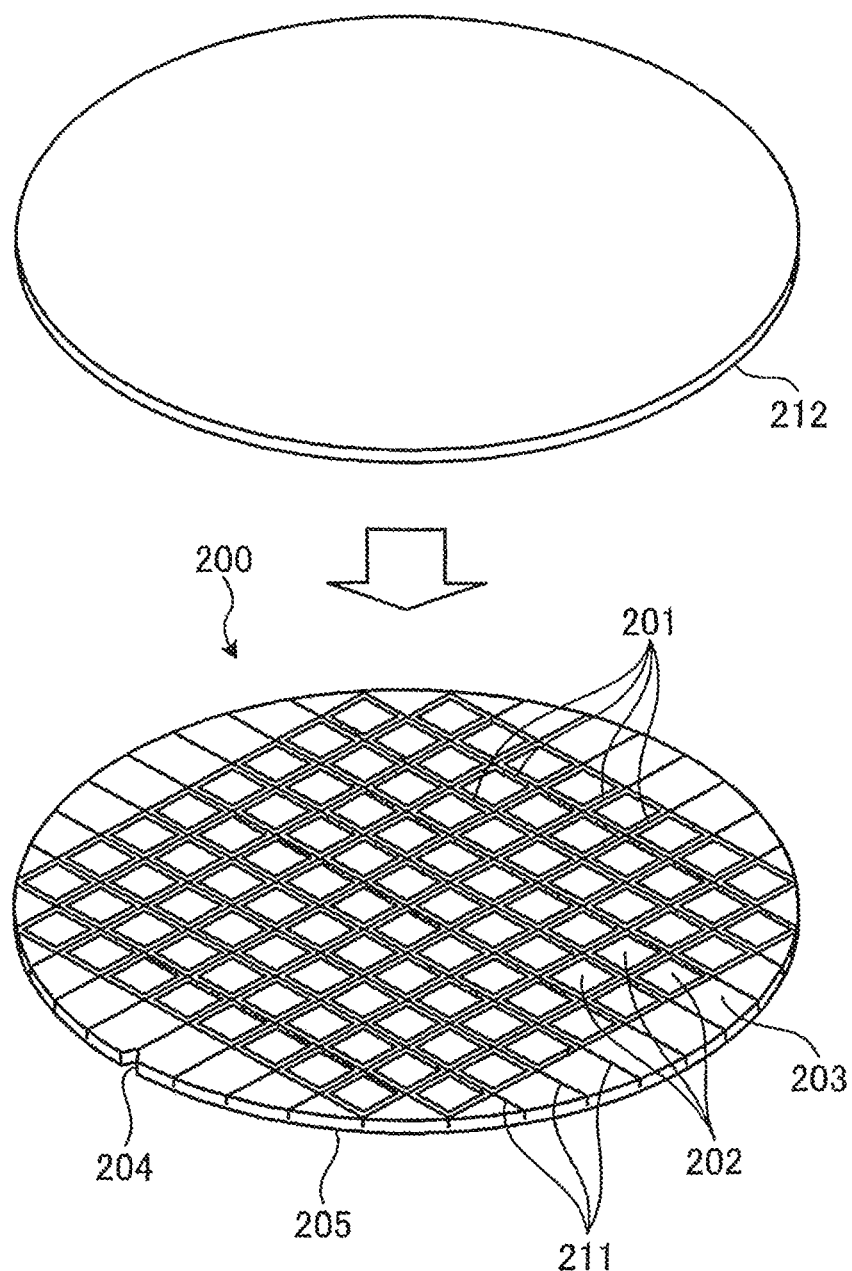
FIG. 17 is a perspective view showing a step of sticking a protective member in the DBG processing step of the processing method shown in FIG. 15.
Figure 18:
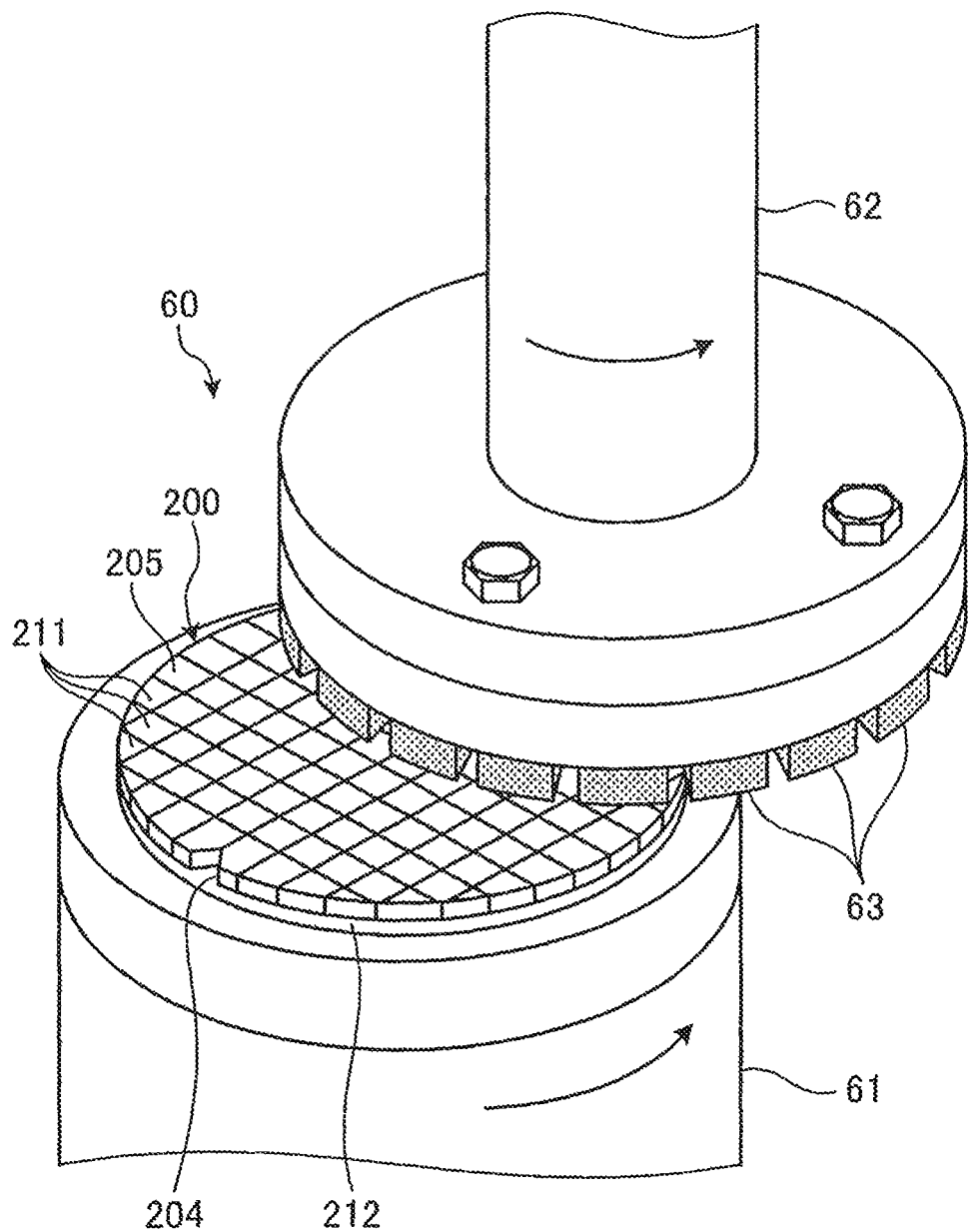
FIG. 18 is a perspective view showing a step of grinding a back surface of a plate-shaped object in the DBG processing step of the processing method shown in FIG. 15.
Figure 19:
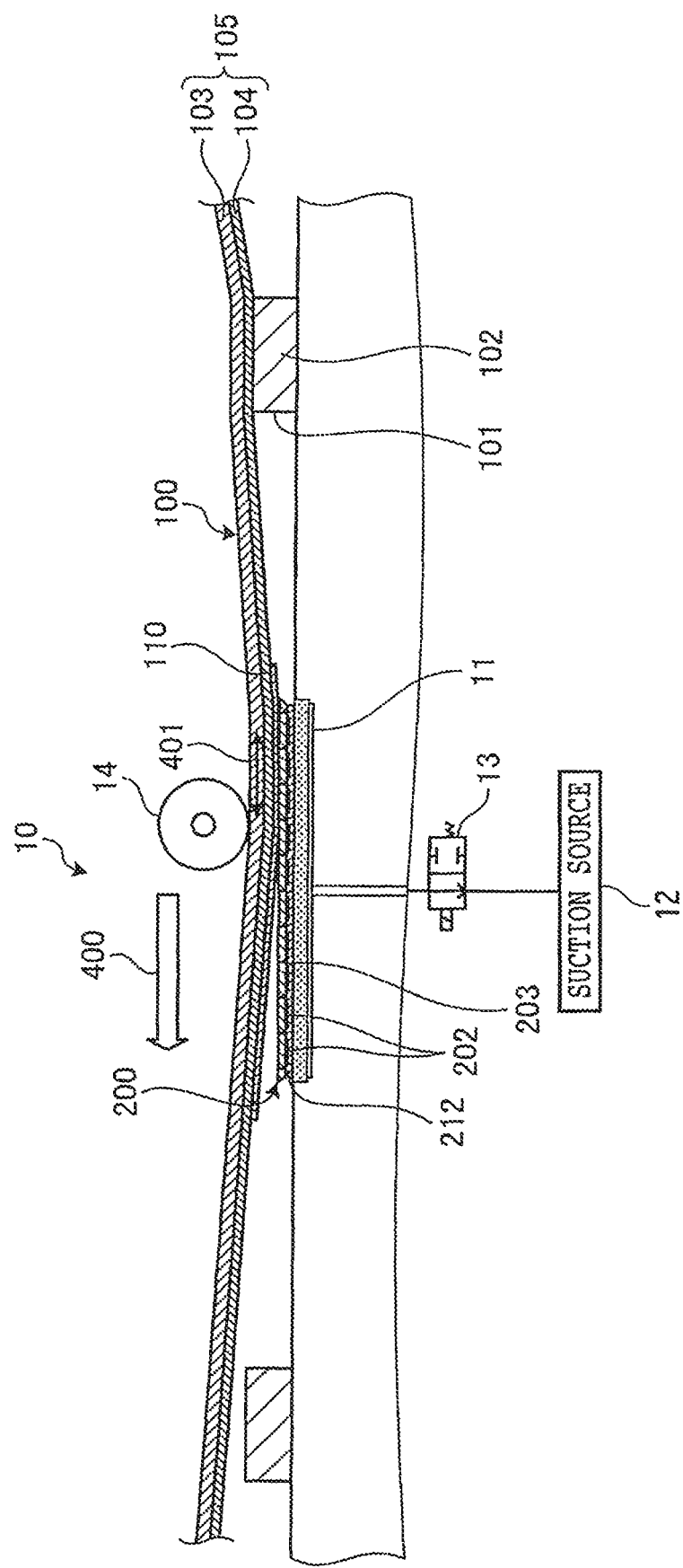
FIG. 19 is a side sectional view showing a sheet sticking step of the processing method shown in FIG. 15.
Figure 20:
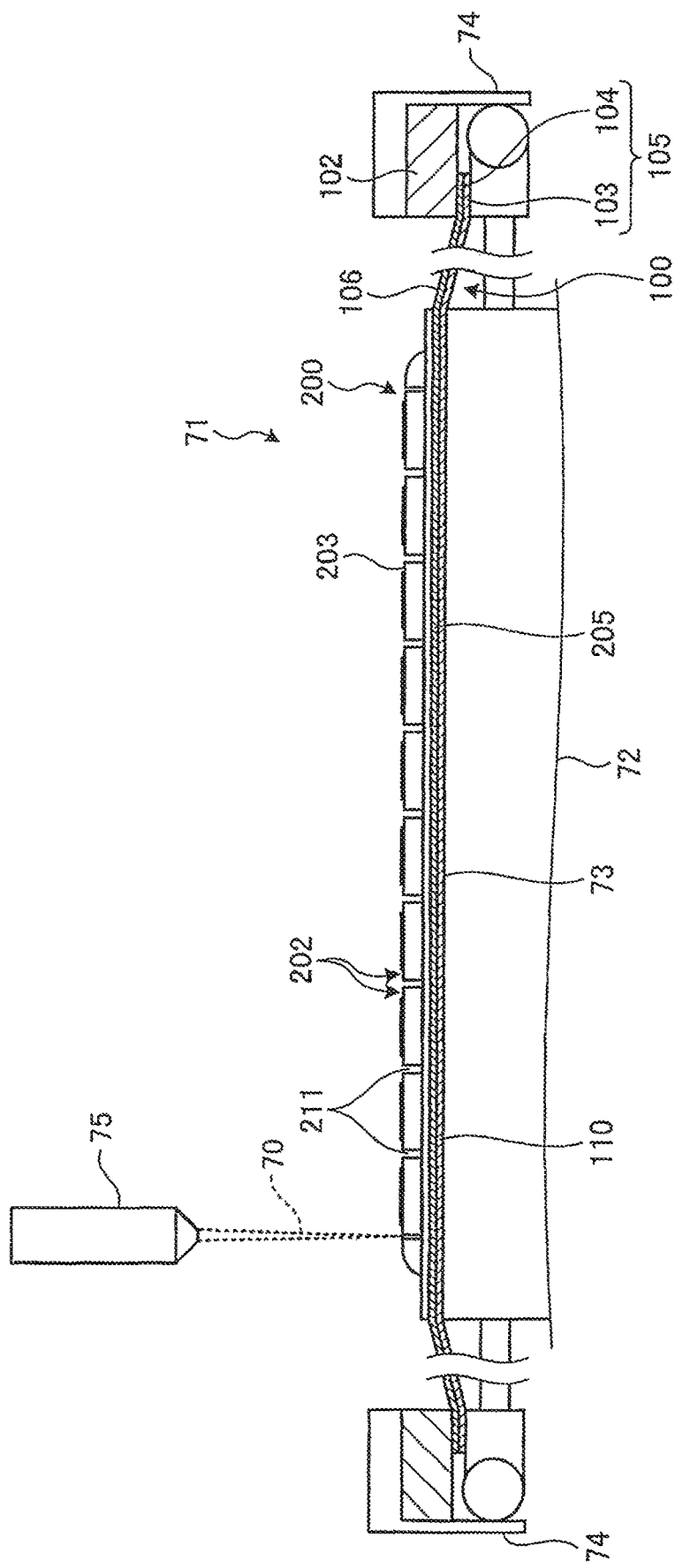
FIG. 20 is a side sectional view showing a DAF cutting step of the processing method shown in FIG. 15.

A sheet sticking method according to a fourth embodiment of the present invention will be described based on the drawings. FIG. 15 is a flowchart showing the flow of a processing method that is the sheet sticking method according to the fourth embodiment. FIG. 16 is a perspective view showing a process of forming dividing grooves in a DBG processing step of the processing method shown in FIG. 15. FIG. 17 is a perspective view showing a process of sticking a protective member in the DBG processing step of the processing method shown in FIG. 15. FIG. 18 is a perspective view showing a process of grinding a back surface of a plate-shaped object in the DBG processing step of the processing method shown in FIG. 15. FIG. 19 is a side sectional view showing a sheet sticking step of the processing method shown in FIG. 15. FIG. 20 is a side sectional view showing a DAF cutting step of the processing method shown in FIG. 15. In FIG. 15 to FIG. 20, the same part as the first embodiment is given the same symbol and description thereof is omitted.

In the processing method that is the sheet sticking method according to the fourth embodiment, as shown in FIG. 15, a DBG processing step ST6, a sheet sticking step ST1-4, the tension alleviation step ST2, and a DAF cutting step ST7 are sequentially carried out.

The DBG processing step ST6 is a step of carrying out dicing before grinding (DBG) processing on the plate-shaped object 200 and dividing the plate-shaped object 200 into the individual devices 202. In the DBG processing step ST6, first a process of forming dividing grooves 211 with a predetermined depth (depth equivalent to the finished thickness of each device 202) along the streets 201 formed in the front surface 203 of the plate-shaped object 200 is carried out. In the process of forming the dividing grooves 211, as shown in FIG. 16, cutting apparatus 50 forms the dividing grooves 211 along the streets 201 by holding the back surface 205 of the plate-shaped object 200 by suction on a chuck table, which is not shown in the diagram, and carrying out cutting feed of the chuck table while rotating a cutting blade 51.

In the DBG processing step ST6, a process of sticking a protective member 212 is carried out after the dividing grooves 211 are formed in all streets 201. In the process of sticking the protective member 212, as shown in FIG. 17, the protective member 212 for grinding is stuck to the front surface 203 in which the dividing grooves 211 have been formed in the streets 201 of the plate-shaped object 200. In the first embodiment, the protective member 212 is a polyolefin sheet with a thickness of 150 μm. However, the protective member 212 is not limited thereto.

In the DBG processing step ST6, a process of grinding the back surface 205 of the plate-shaped object 200 is carried out after the protective member 212 is stuck to the front surface 203 of the plate-shaped object 200. In the process of grinding the back surface 205 of the plate-shaped object 200, as shown in FIG. 18, grinding apparatus 60 holds the front surface 203 of the plate-shaped object 200 by suction over a chuck table 61 with the intermediary of the protective member 212. Then, while the chuck table 61 is rotated around the axial center, grinding abrasives 63 of a grinding unit 62 are rotated around the axial center and are brought into contact with the back surface 205 of the plate-shaped object 200 to grind the back surface 205. In the process of grinding the back surface 205 of the plate-shaped object 200, the grinding apparatus 60 carries out the grinding until the dividing grooves 211 appear outward in the back surface 205 as shown in FIG. 18. By carrying out the grinding until the dividing grooves 211 appear outward in the back surface 205 as above, the plate-shaped object 200 is divided into the individual devices 202.

The sheet sticking step ST1-4 of the processing method that is the sheet sticking method according to the fourth embodiment is a step of sticking a sheet 100 including the base sheet 105 and a die attach sheet 110 disposed on the glue layer 104 of the base sheet 105. The die attach sheet 110 is a special adhesive film used for mounting or stacking the devices 202. The die attach sheet 110 is disposed at a position corresponding to the plate-shaped object 200 on the base sheet 105. In the sheet sticking step ST1-4, the plate-shaped object 200 is held by suction over the suction holding part 11 of the same sticking apparatus 10 as the first embodiment with the intermediary of the protective member 212. Then, as shown in FIG. 19, the die attach sheet 110 of the sheet 100 is stuck to the plate-shaped object 200 divided into the devices 202 and the glue layer 104 of the base sheet 105 of the sheet 100 is stuck to the ring-shaped frame 102. In the sheet sticking step ST1-4, thereafter the protective member 212 is peeled. In the fourth embodiment, in the plate-shaped object unit 300 after the sheet sticking step ST1-4, a phenomenon called die shift in which the arrangement of the individually-divided devices 202 is slightly displaced due to the tension 401 generated in the sheet 100 occurs.

The tension alleviation step ST2 is carried out in the same manner as the processing method that is the sheet sticking method according to the first embodiment. In the plate-shaped object unit 300 after the tension alleviation step ST2, the tension 401 generated in the sheet 100 is alleviated compared with before the tension alleviation step ST2 as with the first embodiment. Therefore, the displacement of the arrangement of the devices 202 (i.e. die shift) is reduced (suppressed) compared with immediately after the sheet sticking step ST1-4.

The DAF cutting step ST7 is a step of irradiating the plate-shaped object unit 300 with a laser beam 70 shown in FIG. 20 with such a wavelength as to be absorbed by the die attach sheet 110 although being not absorbed by the base sheet 105 along the dividing grooves 211 and dividing the die attach sheet 110. In the DAF cutting step ST7, first an operator or the like peels the protective member 212 from the front surface 203 of the plate-shaped object 200 and places the back surface 205 of the plate-shaped object 200 over a porous holding surface 73 of a chuck table 72 of laser processing apparatus 71 that irradiates the plate-shaped object 200 with the laser beam 70 as shown in FIG. 20. Next, the laser processing apparatus 71 sucks the holding surface 73 by a vacuum suction source connected to the chuck table 72 via a vacuum suction path, which is not shown in the diagram, and holds the plate-shaped object 200 by suction by the holding surface 73 of the chuck table 72. Furthermore, the laser processing apparatus 71 drives clamp parts 74 provided around the chuck table 72 and at positions lower than the holding surface 73 by an air actuator, which is not shown in the diagram, and clamps and fixes the ring-shaped frame 102 by the clamp parts 74.

Then, the laser processing apparatus 71 performs alignment of the plate-shaped object 200 based on an image acquired by an imaging unit, which is not shown in the diagram. Thereafter, the laser processing apparatus 71 irradiates the die attach sheet 110 with the laser beam 70 through the dividing groove 211 as shown in FIG. 20 while relatively moving the chuck table 72 and a laser beam irradiation unit 75. Thereby, the die attach sheet 110 is divided along the dividing grooves 211. After the die attach sheet 110 is divided along all dividing grooves 211, the die attach sheet 110 is removed from the base sheet 105 together with the individually-divided devices 202 by pick-up apparatus.

As above, the plate-shaped object 200 of the processing target of the processing method that is the sheet sticking method according to the fourth embodiment is a semiconductor wafer or an optical device wafer for which the die attach sheet 110 is divided along the dividing grooves 211 in the DAF cutting step ST7 after the plate-shaped object 200 is divided into the individual devices 202 in the DBG processing step ST6. However, in the present invention, the plate-shaped object 200 may be a semiconductor wafer or an optical device wafer for which the expanding step ST4 of the first embodiment and so forth is carried out instead of the DAF cutting step ST7 and the die attach sheet 110 is divided along the dividing grooves 211 in the expanding step ST4 after the plate-shaped object 200 is divided into the individual devices 202 in the DBG processing step ST6. Furthermore, in the present invention, the plate-shaped object 200 may be a semiconductor wafer or an optical device wafer for which, after the plate-shaped object 200 is divided into the individual devices 202 in the DBG processing step ST6, the sheet 100 composed only of the base sheet 105 that does not have the die attach sheet 110 as with the first embodiment is stuck in the sheet sticking step ST1-4 and the expanding step ST4 of the first embodiment and so forth is carried out instead of the DAF cutting step ST7 and the interval between the devices 202 is widened.

As described above, in the processing method that is the sheet sticking method according to the fourth embodiment, the tension alleviation step ST2 of alleviating the tension 401 generated in the sheet 100 is carried out after the sheet sticking step ST1-4 is carried out. Thus, the die shift can be suppressed after the tension alleviation step ST2 compared with before the tension alleviation step ST2. If the die shift is large, it becomes difficult to raise the processing rate because the processing is carried out in such a manner as to follow the die shift. Thus, the processing method that is the sheet sticking method can suppress the processing time of the DAF cutting step ST7 and suppress the lowering of the productivity of the devices 202.

Furthermore, in the processing method that is the sheet sticking method according to the fourth embodiment, the sheet 100 includes the base sheet 105 and the die attach sheet 110 and therefore the die attach sheet 110 is stuck to the devices 202 after the dividing. Thus, the devices 202 can be immediately mounted.

First Modification Example

Figure 21:
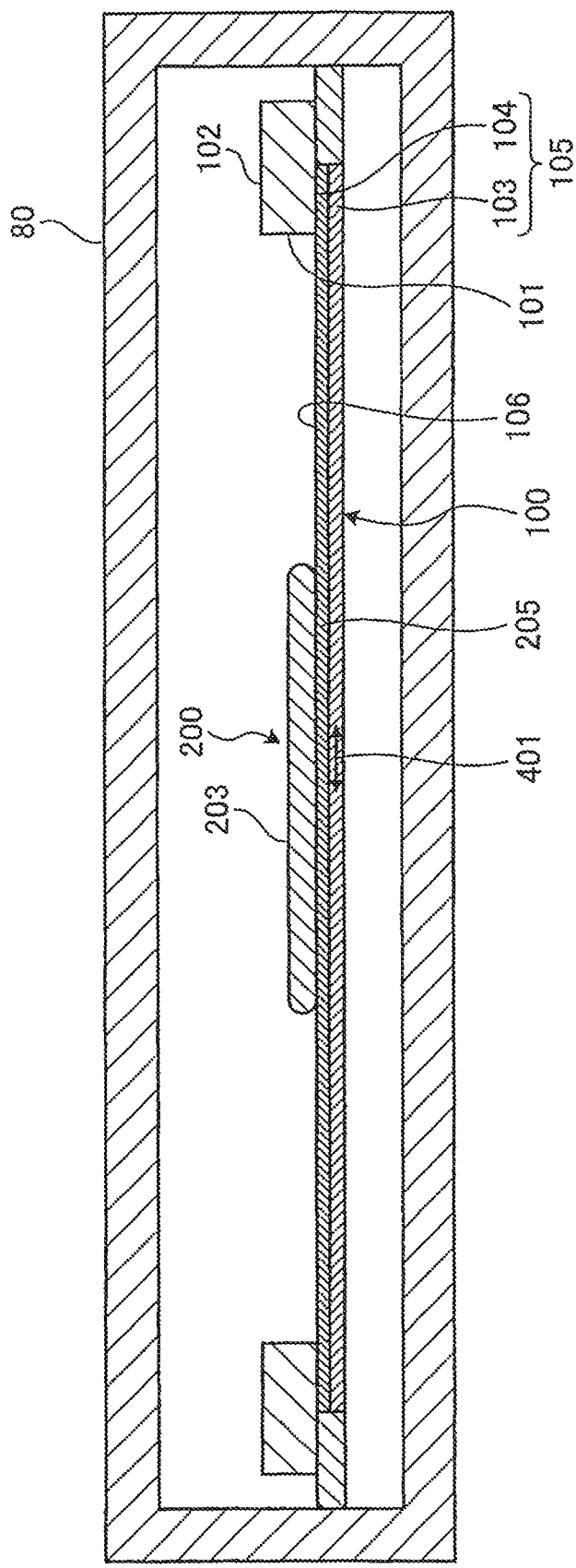
FIG. 21 is a side sectional view showing a tension alleviation step of a sheet sticking method according to a first modification example of the first embodiment to the fourth embodiment.

A sheet sticking method according to a first modification example of the first embodiment to the fourth embodiment of the present invention will be described based on the drawing. FIG. 21 is a side sectional view showing a tension alleviation step of the sheet sticking method according to the first modification example of the first embodiment to the fourth embodiment. In FIG. 21, the same part as the first embodiment to the fourth embodiment is given the same symbol and description thereof is omitted.

In a processing method that is the sheet sticking method according to the first modification example, in a tension alleviation step ST2, the plate-shaped object unit 300 is housed in a thermostatic chamber 80 whose inside is heated to a temperature higher than ordinary temperature (for example, 60° C.) for a predetermined time (for example, one minute) as shown in FIG. 21 and the whole of the plate-shaped object unit 300 is heated to alleviate the tension 401 generated in the sheet 100. In this manner, the tension alleviation step ST2 is carried out by heating the whole of the plate-shaped object unit 300 in the first modification example. In the first modification example, the thermostatic chamber 80 is an industrial oven. However, the thermostatic chamber 80 is not limited thereto. Furthermore, the predetermined time and the temperature of the thermostatic chamber 80 are time and temperature with which the sheet 100 is heated to 50° C. to 90° C. and are time and temperature that weaken the tension 401 generated in the sheet 100 (temperature that alleviates the tension 401). It is preferable for the predetermined time and the temperature of the thermostatic chamber 80 to be time and temperature with which the difference in the interval between the devices 202 adjacent to each other between the direction parallel to the tension 401 and the direction orthogonal to the tension 401 is as small as possible when the sheet 100 is expanded in the expanding step ST4 or time and temperature with which the die shift after the sheet sticking step ST1-4 of the processing method according to the fourth embodiment can be suppressed. Moreover, it is favorable for the predetermined time and the temperature of the thermostatic chamber 80 to be time and temperature with which the devices 202 adjacent to each other can be divided and the interval between the devices 202 becomes an interval that enables the devices 202 after the dividing to be picked up (removed) from the sheet 100 by pick-up apparatus, which is not shown in the diagram, or time and temperature with which the time required for alignment in the DAF cutting step ST7 of the processing method according to the fourth embodiment can be suppressed.

As described above, in the processing method that is the sheet sticking method according to the first modification example, the tension alleviation step ST2 of alleviating the tension 401 generated in the sheet 100 is carried out after the sheet sticking step ST1 is carried out. Therefore, this processing method provides an effect that unevenness of the interval between the devices 202 after the dividing into the devices 202 can be suppressed or the lowering of the productivity of the devices 202 can be suppressed.

Furthermore, in the processing method that is the sheet sticking method according to the first modification example, the whole of the plate-shaped object unit 300 is heated in the tension alleviation step ST2 and thus the tension 401 generated in the sheet 100 can be surely alleviated.

Second Modification Example

Figure 22:
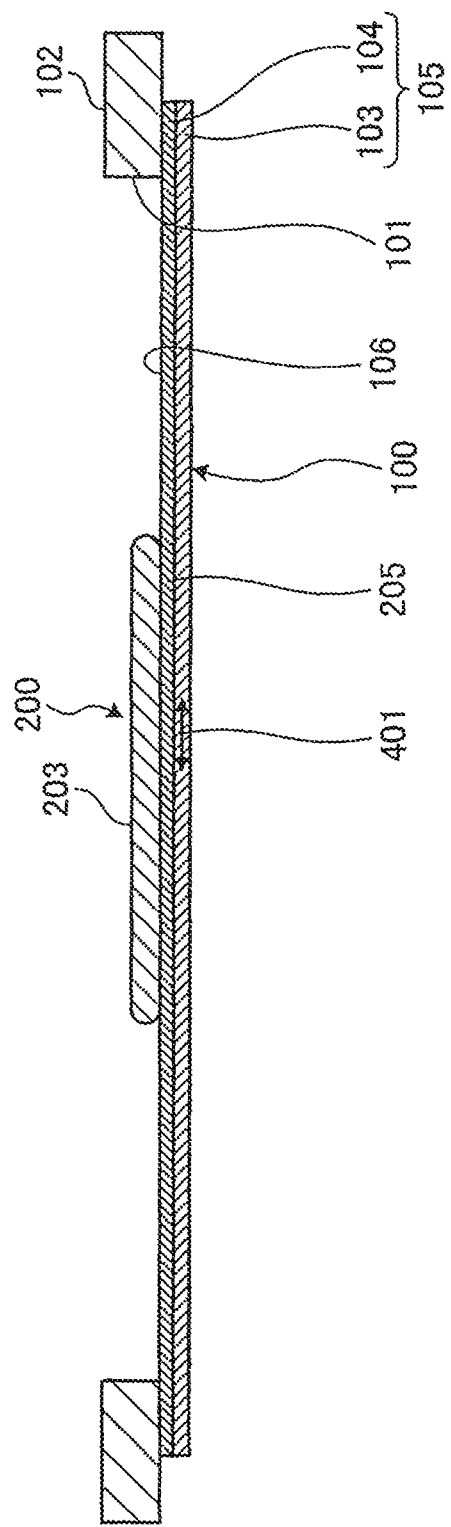
FIG. 22 is a side sectional view showing a tension alleviation step of a sheet sticking method according to a second modification example of the first embodiment to the fourth embodiment.

A sheet sticking method according to a second modification example of the first embodiment to the fourth embodiment of the present invention will be described based on the drawing. FIG. 22 is a side sectional view showing a tension alleviation step of the sheet sticking method according to the second modification example of the first embodiment to the fourth embodiment. In FIG. 22, the same part as the first embodiment to the fourth embodiment is given the same symbol and description thereof is omitted.

In the processing method that is the sheet sticking method according to the second modification example, a tension alleviation step ST2 is setting a certain time interval after the sheet sticking step ST1 is carried out as shown in FIG. 22. In the processing method that is the sheet sticking method according to the second modification example, in the tension alleviation step ST2, the tension 401 generated in the sheet 100 is alleviated based on change in the plate-shaped object unit 300 over time due to the setting of the certain time interval after the sheet sticking step ST1 is carried out. It is preferable for the certain time to be equal to or longer than 24 hours and equal to or shorter than 72 hours, for example. Furthermore, it is preferable for the certain time to be a time that weakens the tension 401 generated in the sheet 100 and be a time with which the difference in the interval between the devices 202 adjacent to each other between the direction parallel to the tension 401 and the direction orthogonal to the tension 401 is as small as possible when the sheet 100 is expanded in the expanding step ST4 or a time with which the die shift after the sheet sticking step ST1-4 of the processing method according to the fourth embodiment can be suppressed. If the certain time is shorter than 24 hours, it is difficult to alleviate the tension 401. If the certain time surpasses 72 hours, the sheet 100 adheres to the plate-shaped object 200 and becomes difficult to peel later.

Moreover, it is favorable for the certain time to be a time with which the devices 202 adjacent to each other can be divided and the interval between the devices 202 becomes an interval that enables the devices 202 after the dividing to be picked up (removed) from the sheet 100 by pick-up apparatus, which is not shown in the diagram, or a time with which the time required for alignment in the DAF cutting step ST7 of the processing method according to the fourth embodiment can be suppressed.

As described above, in the processing method that is the sheet sticking method according to the second modification example, the tension alleviation step ST2 of alleviating the tension 401 generated in the sheet 100 is carried out after the sheet sticking step ST1 is carried out. Therefore, this processing method provides an effect that unevenness of the interval between the devices 202 after the dividing into the devices 202 can be suppressed or the lowering of the productivity of the devices 202 can be suppressed.

Furthermore, in the processing method that is the sheet sticking method according to the second modification example, the certain time interval is set after the sheet sticking step ST1 is carried out in the tension alleviation step ST2. Therefore, the tension 401 generated in the sheet 100 can be surely alleviated based on change in the plate-shaped object unit 300 over time.

Third Modification Example

Figure 23:
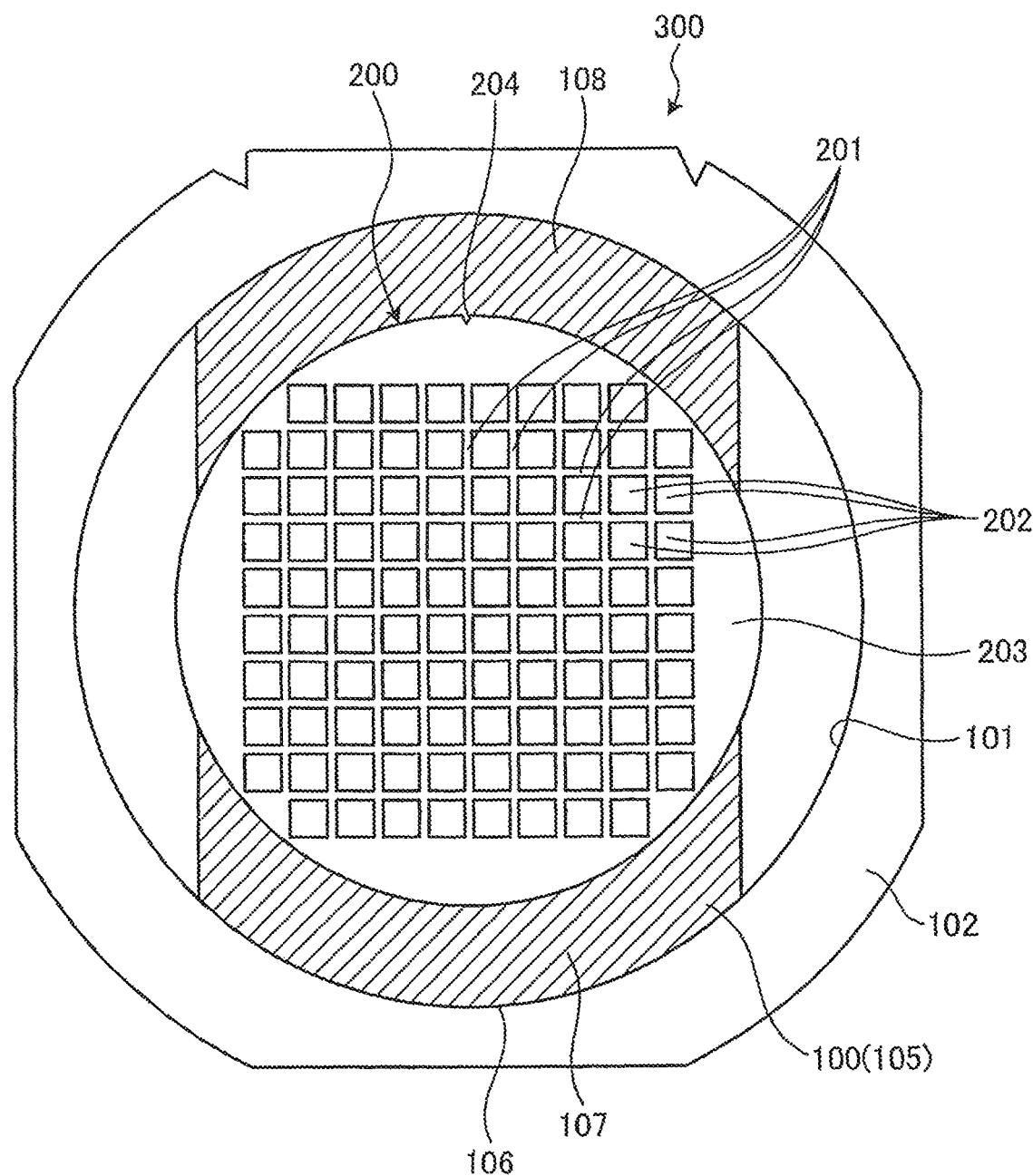
FIG. 23 is a plan view showing a heated part in a sheet in a tension alleviation step of a sheet sticking method according to a third modification example of the first embodiment to the fourth embodiment.

A sheet sticking method according to a third modification example of the first embodiment to the fourth embodiment of the present invention will be described based on the drawing. FIG. 23 is a plan view showing a heated part in a sheet in a tension alleviation step of the sheet sticking method according to the third modification example of the first embodiment to the fourth embodiment. In FIG. 23, the same part as the first embodiment to the fourth embodiment is given the same symbol and description thereof is omitted.

In the processing method that is the sheet sticking method according to the third modification embodiment, in a tension alleviation step ST2, the heating unit 20 heats both end parts 107 and 108 in the direction of the tension 401 represented by parallel oblique lines in FIG. 23 in the region 106 of the sheet 100 to alleviate the tension 401 of the both end parts 107 and 108 as shown in FIG. 23.

As described above, in the processing method that is the sheet sticking method according to the third modification example, the tension alleviation step ST2 of alleviating the tension 401 generated in the sheet 100 is carried out after the sheet sticking step ST1 is carried out. Therefore, this processing method provides an effect that unevenness of the interval between the devices 202 after the dividing into the devices 202 can be suppressed or the lowering of the productivity of the devices 202 can be suppressed.

Furthermore, in the processing method that is the sheet sticking method according to the third modification example, both, the end parts 107 and 108 of the region 106 of the sheet 100 are heated to alleviate the tension 401 of both these end parts 107 and 108 in the tension alleviation step ST2. Therefore, this processing method provides an effect that unevenness of the interval between the devices 202 after the dividing into the devices 202 can be suppressed or the lowering of the productivity of the devices 202 can be suppressed.

Figure 24:
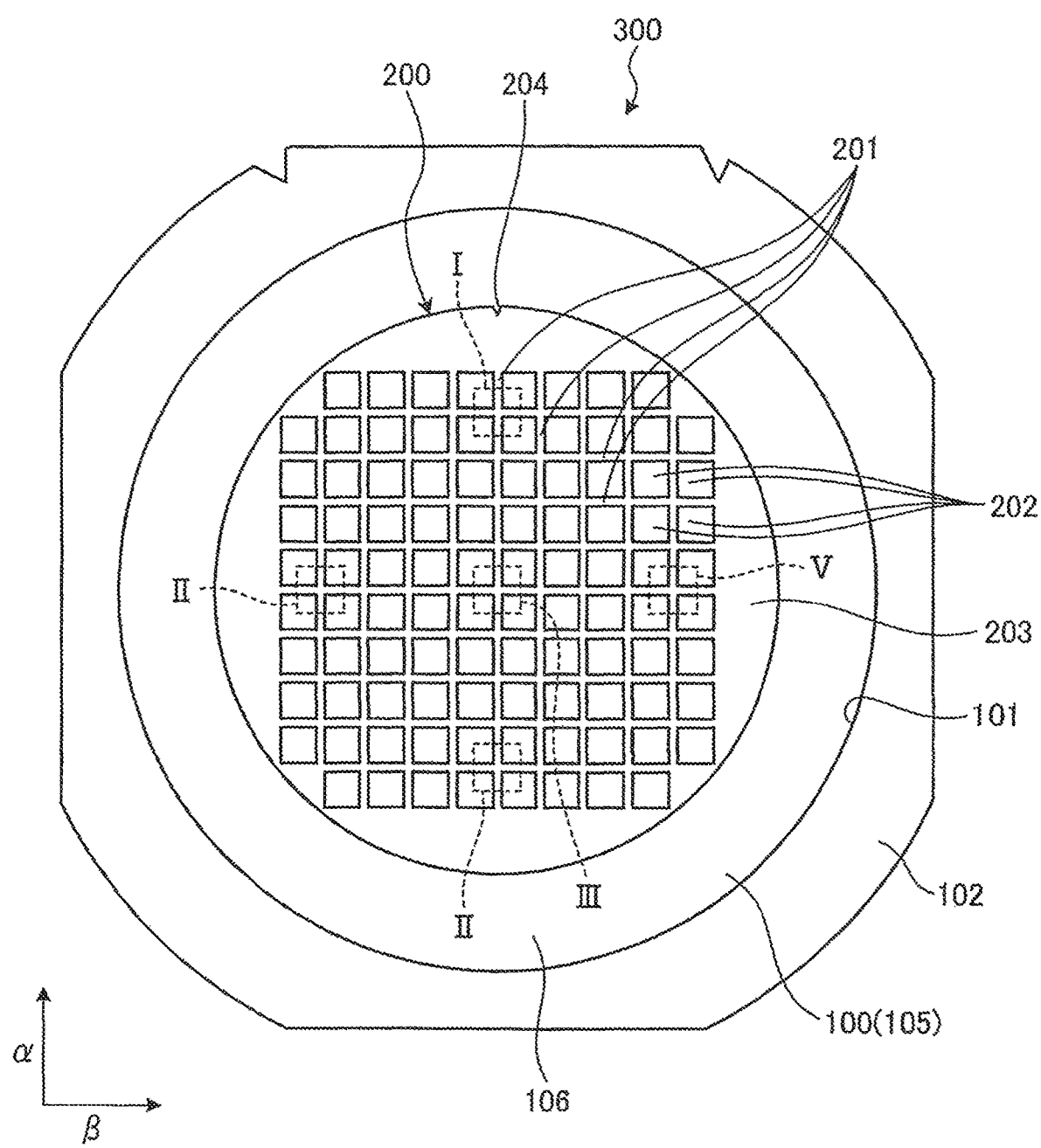
FIG. 24 is a plan view of a plate-shaped object unit showing measurement positions when effects of the first embodiment were checked.

Next, the inventor of the present invention checked the effects of the above-described first embodiment. The result is shown in the following Table 1. FIG. 24 is a plan view of the plate-shaped object unit showing measurement positions when the effects of the first embodiment were checked.

TABLE 1

| Measurement Position | I | II | III | IV | V |
|---|---|---|---|---|---|
| Comparative Example 1 | 37.5% | 50.0% | 50.0% | 30.0% | 25.0% |
| Present Invention Product 1 | 63.3% | 80.0% | 42.9% | 60.0% | 60.0% |
| Comparative Example 2 | 71.4% | 83.3% | 50.0% | 42.9% | 40.0% |
| Present Invention Product 2 | 85.7% | 75.0% | 66.7% | 83.3% | 66.7% |

Table 1 shows the result of measurement of unevenness of the interval between the devices 202 after the expanding step ST4 regarding comparative example 1, comparative example 2, present invention product 1, and present invention product 2. The same sheet 100 was used for comparative example 1 and present invention product 1. The same sheet 100 different from comparative example 1 and present invention product 1 was used for comparative example 2 and present invention product 2. That is, the sheets 100 of comparative example 1 and present invention product 1 are identical sheets in which the base material layers 103 and the glue layers 104 are of the same kind and have the same thickness. The sheets 100 of comparative example 2 and present invention product 2 are identical sheets in which the base material layers 103 and the glue layers 104 are of the same kind and have the same thickness.

For comparative example 1 and comparative example 2, a conventional processing method in which the tension alleviation step ST2 in the processing method according to the first embodiment was not carried out for the plate-shaped object unit 300 was carried out. For present invention product 1 and present invention product 2, the processing method according to the first embodiment was carried out for the plate-shaped object unit 300. For present invention product 1, the plate-shaped object unit 300 was housed for one minute in the thermostatic chamber 80 whose inside was heated to 60° C. shown in FIG. 21 in the first modification example to carry out the tension alleviation step ST2. For present invention product 2, the hot air 21 at 220° C. was blown from the heating unit 20 to the region 106 of the sheet 100 of the plate-shaped object unit 300 for 30 seconds and the region 106 was heated from ordinary temperature to 90° C. to carry out the tension alleviation step ST2.

Furthermore, Table 1 shows the ratio between the interval between the devices 202 in an α-direction in FIG. 24 and the interval between the devices 202 in a β-direction after the expanding step ST4 at measurement position I, measurement position II, measurement position III, measurement position IV, and measurement position V in FIG. 24. Table 1 represents, as the ratio, the ratio of the shorter interval to the longer interval in the interval between the devices 202 in the α-direction and the interval between the devices 202 in the β-direction in percentage. Measurement position I exists near the notch 204. Measurement position II is a position on the opposite side to measurement position I across the center of the plate-shaped object 200. Measurement position III exists at a central part including the center of the plate-shaped object 200. Measurement position IV is a position on the left side in FIG. 24 near the outer circumferential edge of the plate-shaped object 200. Measurement position V is a position on the right side in FIG. 24 on the opposite side to measurement position IV across the center of the plate-shaped object 200.

According to Table 1, it turns out that, in present invention product 1, the numerical value in Table 1 was improved regarding most of measurement positions I, II, III, IV, and V compared with comparative example 1 and unevenness of the interval between the devices 202 after dividing into the devices 202 was suppressed. According to Table 1, it turns out that, in present invention product 2, the numerical value in Table 1 was improved regarding most of measurement positions I, II, III, IV, and V compared with comparative example 2 and unevenness of the interval between the devices 202 after dividing into the devices 202 was suppressed. Thus, according to Table 1, it turns out that, in the processing method according to the first embodiment, unevenness of the interval between the devices 202 after dividing into the devices 202 can be suppressed by carrying out the tension alleviation step ST2 of alleviating the tension 401 generated in the sheet 100 after carrying out the sheet sticking step ST1.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A sheet sticking method for sticking a sheet to a plate-shaped object, the sheet sticking method comprising:
   a sheet sticking step of sticking the sheet to the plate-shaped object and mounting the sheet to which the plate-shaped object is stuck to a ring-shaped frame having an opening to form a plate-shaped object unit including the ring-shaped frame, the plate-shaped object housed in the opening of the ring-shaped frame, and the sheet stuck to the plate-shaped object, wherein said sheet sticking step includes using a roller to stick the sheet to the plate-shaped object;
   a tension alleviation step of alleviating tension generated in the sheet in the sheet sticking step after the sheet sticking step is carried out, wherein the tension alleviation step includes applying heat, via a heat source, to the sheet with the plate-shaped object facing the heat source, and further wherein the tension alleviation step is started after completely performing the sheet sticking step, wherein said heat is applied until a region being heated is at a temperature of between 50° C. and 90° C.;

a modified layer forming step of irradiating the plate-shaped object with a laser beam to form a modified layer that serves as a starting point for breaking the plate-shaped object into a plurality of devices, wherein the modified layer forming step is performed after the tension alleviation step; and a dividing step of dividing the plate-shaped object into the plurality of devices, wherein the dividing step is performed after the tension alleviation step, wherein the tension alleviation step is carried our by only directing heat to an annular area of the sheet exposed between an outer circumferential edge of the plate-shaped object of the plate-shaped object unit and an inner circumferential edge of the ring-shaped frame.

2. The sheet sticking method according to claim 1, wherein:

the sheet includes a base sheet and a die attach sheet disposed on the base sheet.

3. A sheet sticking method for sticking a sheet to a plate-shaped object, the sheet sticking method comprising:

a sheet sticking step of sticking the sheet to the plate-shaped object and mounting the sheet to which the plate-shaped object is stuck to a ring-shaped frame having an opening to form a plate-shaped object unit including the ring-shaped frame, the plate-shaped object housed in the opening of the ring-shaped frame, and the sheet stuck to the plate-shaped object, wherein said sheet sticking step includes using a roller to stick the sheet to the plate-shaped object;

a tension alleviation step of alleviating tension generated in the sheet in the sheet sticking step after the sheet sticking step is carried out, wherein the tension alleviation step includes applying heat to the sheet after performing the sheet sticking step;

a modified layer forming step of irradiating the plate-shaped object with a laser beam to form a modified layer that serves as a starting point for breaking the plate-shaped object into a plurality of devices, wherein the modified layer forming step is performed after the tension alleviation step; and a dividing step of dividing the plate-shaped object into the plurality of devices, wherein the dividing step is performed after the tension alleviation step, wherein the tension alleviation step is carried out by only directing heat to an annular area of the sheet exposed between an outer circumferential edge of the plate-shaped object of the plate-shaped object unit and an inner circumferential edge of the ring-shaped frame.

4. The sheet sticking method of claim 3, wherein said heat is applied until a region being heated is at a temperature of between 50° C. and 90° C.

5. A sheet sticking method for sticking a sheet to a plate-shaped object, the sheet sticking method comprising:

a sheet sticking step of sticking the sheet to the plate-shaped object and mounting the sheet to which the plate-shaped object is stuck to a ring-shaped frame having an opening to form a plate-shaped object unit including the ring-shaped frame, the plate-shaped object housed in the opening of the ring-shaped frame, and the sheet stuck to the plate-shaped object, wherein said sheet sticking step includes moving a roller in a first direction with respect to the plate shaped object in order to stick the sheet to the plate-shaped object; and a tension alleviation step of alleviating tension generated in the sheet in the sheet sticking step after the sheet sticking step is carried out, wherein the sheet includes an annular peripheral area defined between an outer peripheral edge of the plate-shaped object and an inner peripheral edge of the ring-shaped frame, and further wherein said annular peripheral area includes a pair of end parts and a pair of side parts connecting the pair of end parts to each other, wherein said pair of side parts are each located on a different side with respect to the first direction, and wherein the tension alleviation step comprises directing heat only to said pair of end parts, without directing heat to said pair of side parts.

6. The sheet sticking method according to claim 5, further comprising:

a dividing step of dividing the plate-shaped object into a plurality of devices, wherein the dividing step is performed after the tension alleviation step.

7. The sheet sticking method of claim 5, wherein said heat is applied until said pair of end parts are at a temperature of between 50° C. and 90° C.

8. A sheet sticking method for sticking a sheet to a plate-shaped object, the sheet sticking method comprising:

a groove forming step of forming a groove along each of a plurality of streets formed on a surface of the plate-shaped object;

a grinding step of grinding a back surface of the plate-shaped object until reaching a base of each of the grooves, thereby dividing the plate-shaped object into a plurality of individual devices, wherein the grinding step is performed after the groove forming step;

a sheet sticking step of sticking the sheet to the plate-shaped object and mounting the sheet to which the plate-shaped object is stuck to a ring-shaped frame having an opening to form a plate-shaped object unit including the ring-shaped frame, the plate-shaped object housed in the opening of the ring-shaped frame, and the sheet stuck to the plate-shaped object, wherein said sheet sticking step includes using a roller to stick the sheet to the plate-shaped object, wherein the sheet includes a base sheet and a die attach sheet; and a tension alleviation step of alleviating tension generated in the sheet in the sheet sticking step, wherein the tension alleviation step is performed after performing the sheet sticking step; and a DAF cutting step of irradiating the plate shaped object with a laser beam of a wavelength that is absorbed by the die attach sheet and not absorbed by the base sheet along each of the plurality of streets, thereby dividing the die attach sheet, wherein the DAF cutting step is performed after performing the tension alleviation step;

wherein the tension alleviation step is carried out by only directing heat to an annular area of the sheet exposed between an outer circumferential edge of the plate-shaped object of the plate-shaped object unit and an inner circumferential edge of the ring-shaped frame.

9. The sheet sticking method according to claim 8, wherein:

the tension alleviation step is carried out by applying heat until a region being heated is at a temperature of between 50° C. and 90° C.

10. The sheet sticking method according to claim 8, wherein the sheet sticking step is performed after the grinding step, and then the sheet is stuck to the divided individual devices.

* * * * *